United States Patent
Gardner et al.

(10) Patent No.: US 11,107,733 B2
(45) Date of Patent: Aug. 31, 2021

(54) MULTI-DIMENSIONAL PLANES OF LOGIC AND MEMORY FORMATION USING SINGLE CRYSTAL SILICON ORIENTATIONS

(71) Applicant: Tokyo Electron Limited, Tokyo (JP)

(72) Inventors: Mark I. Gardner, Cedar Creek, TX (US); H. Jim Fulford, Marianna, FL (US); Jeffrey Smith, Clifton Park, NY (US); Lars Liebmann, Mechanicville, NY (US); Daniel Chanemougame, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/704,583

(22) Filed: Dec. 5, 2019

(65) Prior Publication Data

US 2021/0043516 A1 Feb. 11, 2021

Related U.S. Application Data

(60) Provisional application No. 62/883,194, filed on Aug. 6, 2019.

(51) Int. Cl.
| | |
|---|---|
| *H01L 21/822* | (2006.01) |
| *H01L 21/02* | (2006.01) |
| *H01L 21/311* | (2006.01) |
| *H01L 21/306* | (2006.01) |
| *H01L 21/762* | (2006.01) |

(52) U.S. Cl.
CPC .... *H01L 21/8221* (2013.01); *H01L 21/02532* (2013.01); *H01L 21/02595* (2013.01); *H01L 21/02609* (2013.01); *H01L 21/02639* (2013.01); *H01L 21/02675* (2013.01); *H01L 21/30625* (2013.01); *H01L 21/31144* (2013.01); *H01L 21/76224* (2013.01)

(58) Field of Classification Search
None
See application file for complete search history.

(56) References Cited

U.S. PATENT DOCUMENTS

| | | |
|---|---|---|
| 4,768,076 A | 8/1988 | Aoki et al. |
| 6,759,712 B2 | 7/2004 | Bhattacharyya |
| (Continued) | | |

FOREIGN PATENT DOCUMENTS

| | | |
|---|---|---|
| JP | 2003-197526 A | 7/2003 |
| JP | 2006-49647 A | 2/2006 |

OTHER PUBLICATIONS

International Search Report and Written Opinion dated Oct. 12, 2020 in PCT/US2020/039370, 11 pages.

*Primary Examiner* — Asok K Sarkar
(74) *Attorney, Agent, or Firm* — Oblon, McClelland, Maier & Neustadt, L.L.P.

(57) ABSTRACT

A method of forming transistor devices includes forming a first transistor plane on a substrate, the first transistor plane including at least one layer of field effect transistors; depositing a first insulator layer on the first transistor plane; forming holes in the first insulator layer using a first etch mask; depositing a first layer of polycrystalline silicon on the first insulator layer, the first layer of polycrystalline filling the holes and covering the first insulator layer; and annealing the first layer of polycrystalline silicon using laser heating, the laser heating creating regions of single-crystal silicon. A top surface of the first transistor plane is a top surface of a stack of silicon formed by epitaxial growth.

20 Claims, 38 Drawing Sheets

(56) References Cited

U.S. PATENT DOCUMENTS

| | | |
|---|---|---|
| 6,908,798 B1 | 6/2005 | Bhattacharyya |
| 6,911,359 B2 | 6/2005 | Hiroshima |
| 7,078,275 B2 | 7/2006 | Hiroshima et al. |
| 7,148,511 B2 | 12/2006 | Jiroku |
| 7,229,865 B2 | 6/2007 | Bhattacharyya |
| 7,432,173 B2 | 10/2008 | Kang et al. |
| 2003/0160263 A1 | 8/2003 | Hiroshima |
| 2004/0051140 A1 | 3/2004 | Bhattacharyya |
| 2004/0079944 A1 | 4/2004 | Hiroshima et al. |
| 2005/0224881 A1 | 10/2005 | Bhattacharyya |
| 2006/0027811 A1 | 2/2006 | Jiroku |
| 2007/0224789 A1 | 9/2007 | Kang et al. |

MULTI-DIMENSIONAL PLANES OF LOGIC AND MEMORY FORMATION USING SINGLE CRYSTAL SILICON ORIENTATIONS

CROSS-REFERENCE TO RELATED APPLICATIONS

This application claims the benefit of priority to provisional application No. 62/883,194 filed Aug. 6, 2019, the entire contents of which are incorporated herein by reference.

BACKGROUND

Technical Field

The present disclosure is directed to microelectronic devices including semiconductor devices, transistors, and integrated circuits, including methods of microfabrication.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. Various approaches to 3D integration for logic chips (CPU (central processing unit), GPU (graphics processing unit), FPGA (field programmable gate array, SoC (System on a chip)) have been pursued. A common form of 3D integrated circuit design has been wafer bonding. Wafer bonding is a method where several thin-film devices are bonded cumulatively, which allows a large number of device layers. The method involves fabrication of separate devices in separate wafers, reduction in the thickness of the wafers, providing front and back leads, and connecting the thinned die to each other. The method has been used to fabricate 3D integrated circuits with more than three active layers. Still, there is a need for 3D semiconductors with higher density logic circuits for maximum use of silicon base area stacked vertically.

It is one object of the present disclosure to form multiple planes of transistors by using laser annealing and/or metal crystal induced annealing to convert polycrystalline silicon to single crystal silicon. Other objectives include making upper silicon planes to be a preferred crystal orientation. In some aspects, upper transistor planes for different regions of a wafer can have multiple single crystal orientation types.

SUMMARY

A first exemplary aspect is a method of forming transistor devices, including forming a first transistor plane on a substrate, the first transistor plane including at least one layer of field effect transistors, depositing a first insulator layer on the first transistor plane, forming holes in the first insulator layer using a first etch mask, depositing a first layer of polycrystalline silicon on the first insulator layer, the first layer of polycrystalline silicon filling the holes and covering the first insulator layer, and annealing the first layer of polycrystalline silicon using laser heating, the laser heating creating regions of single-crystal silicon.

A second exemplary aspect is wherein the forming the holes includes forming holes in the first insulator layer at a predetermined spacing and location.

A third exemplary aspect is wherein the predetermined spacing and location of the holes defines a location of grain boundaries.

A fourth exemplary aspect is wherein the forming the holes includes etching partially into the first insulator layer without uncovering the first transistor plane.

A fifth exemplary aspect further includes narrowing the holes to result in sloped sidewalls such that a hole diameter narrows from a top surface of the first insulator layer to a depth within the first insulator layer.

A sixth exemplary aspect further includes planarizing the first layer of polycrystalline silicon subsequent to annealing the first layer of polycrystalline silicon and prior to removing grain boundaries.

A seventh exemplary aspect is wherein the forming the holes includes etching through the first insulator layer and uncovering a top surface of the first transistor plane, the depositing the first layer of polycrystalline silicon on the first insulator layer includes depositing the first layer of polycrystalline silicon to contact the top surface of the first transistor plane, filling the holes, and covering the first insulator layer, and the annealing the first layer of polycrystalline silicon using laser heating creates the regions of the single-crystal silicon having a crystal orientation corresponding to the top surface of the first transistor plane that is in contact with each region of polycrystalline silicon through a corresponding hole.

An eighth exemplary aspect further includes removing grain boundaries separating the regions of single-crystal silicon using a second etch mask so that the regions of single-crystal silicon are separated by trenches, and filling the trenches with a dielectric material.

A ninth exemplary aspect is wherein a top surface of the first transistor plane is a top surface of a stack of silicon formed by epitaxial growth.

A tenth exemplary aspect is a method of forming transistor devices including forming a first transistor plane on a substrate, the first transistor plane including at least one layer of field effect transistors, depositing a first insulator layer on the first transistor plane, forming holes that extend partially into the first insulator layer using a first etch mask, depositing a first layer of polycrystalline silicon on the first insulator layer, the first layer of polycrystalline silicon filling the holes and covering the first insulator layer, forming a first relief pattern on the first layer of polycrystalline silicon, the first relief pattern defining openings of a first geometry that uncover first portions of the first layer of polycrystalline silicon, depositing a first metal on the substrate, the first metal being deposited within the defined openings of the first relief pattern and adopting the first geometry such that depositions of the first metal having the first geometry are in contact with the first layer of polycrystalline silicon, thermally annealing the first layer of polycrystalline silicon, the first metal having the first geometry inducing crystallization of silicon of a first orientation within the holes, planarizing the substrate down to a top surface of the first insulator layer, depositing a second layer of polycrystalline silicon on the first insulator layer, the second layer of polycrystalline silicon being in contact with crystallized silicon filling the holes, and annealing the second layer of polycrystalline silicon using laser heating, the laser heating creating regions of single-crystal silicon having the first orientation.

An eleventh exemplary aspect further includes removing grain boundaries separating the regions of single-crystal silicon using a second etch mask so that the regions of single-crystal silicon are separated by trenches, and filling the trenches with a dielectric material.

A twelfth exemplary aspect is wherein forming the holes includes forming holes in the first insulator layer at a predetermined spacing and location.

A thirteenth exemplary aspect is wherein the predetermined spacing and location of the holes defines a location of grain boundaries.

A fourteenth exemplary aspect is wherein forming the holes includes the etching partially into the first insulator layer without uncovering the first transistor plane.

A fifteenth exemplary aspect further includes planarizing the first layer of polycrystalline silicon subsequent to annealing the first layer of polycrystalline silicon and prior to removing grain boundaries.

A sixteenth exemplary aspect is wherein the first orientation is a 100 plane orientation crystal structure.

A seventeenth exemplary aspect is wherein the first orientation is a 110 plane orientation crystal structure.

An eighteenth exemplary aspect is wherein the first orientation is a 111 plane orientation crystal structure.

A nineteenth exemplary aspect is wherein after the depositing the first metal and before the thermally annealing, forming a second relief pattern on the first layer of polycrystalline silicon, the second relief pattern defining second openings of a second geometry that uncover second portions of the first layer of polycrystalline silicon, and depositing a second metal on the substrate, the second metal being deposited within the defined second openings of the second relief pattern and adopting the second geometry such that depositions of the second metal having the second geometry are in contact with the first layer of polycrystalline silicon, wherein the thermally annealing the first layer of polycrystalline silicon, the second metal having the second geometry inducing crystallization of silicon of a second orientation within second holes, and wherein the annealing the second layer of polycrystalline silicon using laser heating, the laser heating creating regions of single-crystal silicon having a given orientation from corresponding holes.

A twentieth exemplary aspect is wherein the first geometry induces a 100 plane orientation, and wherein the second geometry induces a 110 plane orientation.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
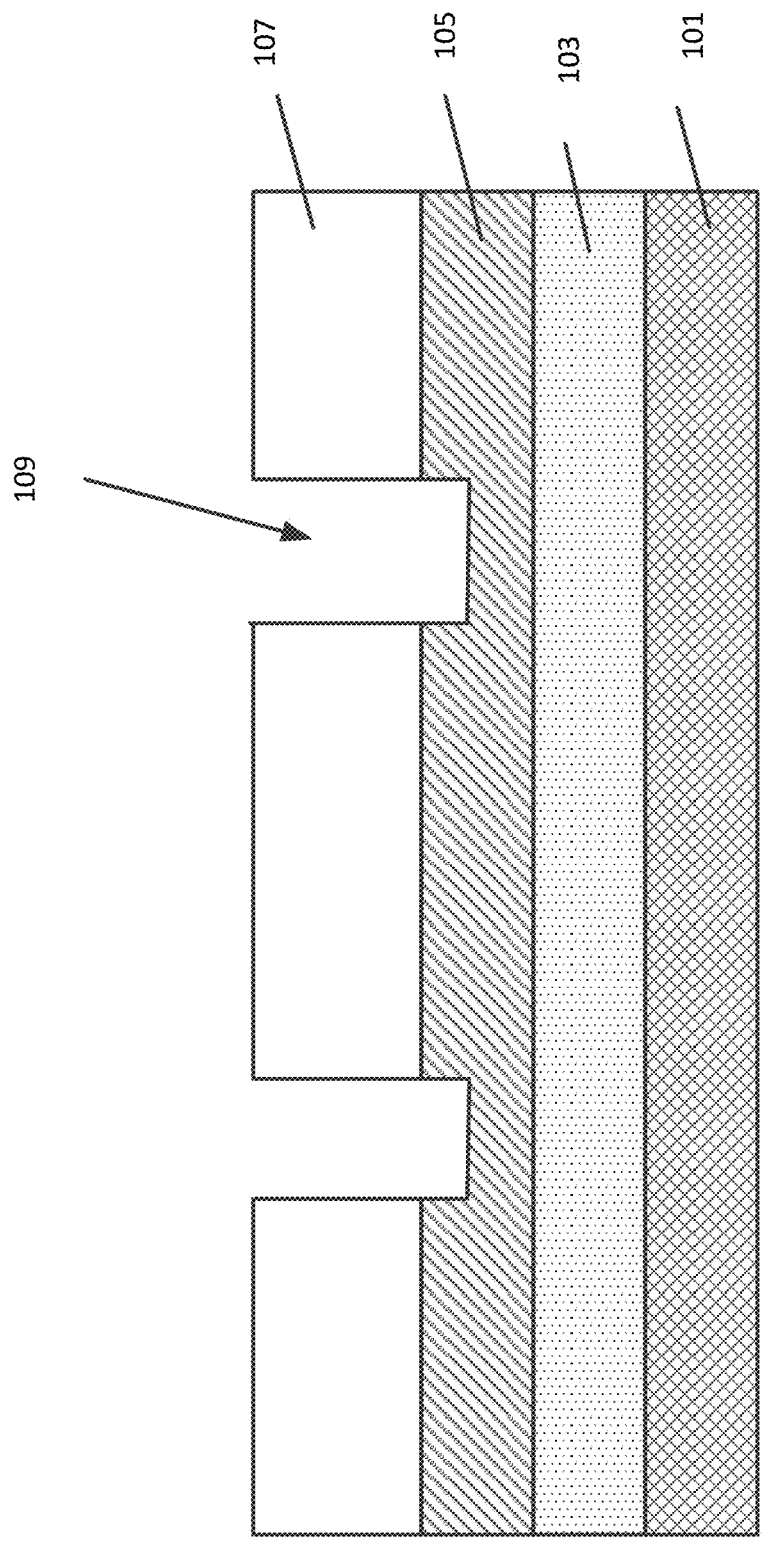
FIG. 1 illustrates executing an etch operation that creates openings within the insulator layer.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Techniques herein include a method to form multiple planes of transistors. This includes enabling greater than 20 3D nanoplanes of high quality silicon base. Single-crystal silicon is the ultimate channel material for transistors to provide optimum device properties (i.e. Idsat, mobility, Idoff, Vtcc et cetera). Techniques herein provide methods to make multiple planes of single-crystal silicon (monocrystalline silicon) for some process flows. Different silicon crystal orientations are also provided herein on upper substrate planes with different options. Techniques herein include forming a 100 and/or 110 plane single-crystal silicon lattices on an upper silicon plane from polycrystalline silicon using laser annealing and a dual step to re-crystallization of the polysilicon with a second process flow. Accordingly techniques herein can be used for making multiple planes of transistors. For example, techniques herein can be used to make a large number of complementary field effect transistor (CFET) (nmos over pmos) nanoplane layers to be replicated by converting polysilicon using a laser anneal on upper base substrate planes to single-crystal silicon, followed by formation of transistor, logic, or memory planes.

An aspect is a method of making upper substrate planes without using a silicon seed layer. This method produces single crystal silicon layer without preferred crystal orientation.

A further aspect is a method of making upper substrate planes using the silicon substrate (or upper substrate) as a seed layer. This method makes the upper plane crystal the same as the substrate, i.e. a (100) substrate produces a (100) orientation for an upper plane.

A further aspect is a method of making upper substrate planes using the top Nano plane epitaxial layer as a seed layer, i.e. a (100) monoplane epitaxial layer produces a (100) orientation for an upper silicon plane.

A further aspect is a method of making single crystal silicon with one preferred crystal orientation without using a silicon substrate or epitaxial nanostack as a silicon seed layer. This method utilizes a deposited metal seed on top of the polycrystalline region to be converted to single crystal with preferred crystal orientation that can be either the same or different than the silicon substrate.

A further aspect is a method of making single crystal silicon with two or more preferred crystal orientation on one or more upper silicon planes without using a silicon substrate as a silicon seed layer. On one silicon plane, two or more distinct silicon crystal regions can be formed with preferred crystal orientations on different parts of the upper silicon substrate.

Combinations of these methods are possible. Also, these methods may be performed on different regions of a wafer to provide logic, memory, and circuit structures.

While traditional CMOS processes improves signal propagation speed, scaling from current manufacturing and chip-design technologies is becoming more difficult and costly. 3D integrated circuits address the scaling challenge by stacking 2D dies and connecting them in the 3rd dimension. The most common form of 3D integrated circuit design has been wafer bonding. Wafer bonding is a method where several thin-film devices are bonded cumulatively, which allows a large number of device layers. The method involves fabrication of separate devices in separate wafers, reduction in the thickness of the wafers, providing front and back leads, and connecting the thinned die to each other. The method has been used to fabricate 3D integrated circuits with more than three active layers. 3D integrated circuits are currently used for NAND flash memory in mobile devices. However, the demand for smaller packages and the move to multi-dimensional planes of logic as well as memory requires alternative approaches to fabrication.

Monolithic 3D integrated circuits are built in layers on a single semiconductor wafer. With monolithic 3D integrated circuits, there is no need for aligning, thinning, bonding, or through silicon Vias. However, creation of multiple thin layers of defect free silicon requires utilizing low temperature bond and placing them on top of active transistor circuitry.

In order to make multi-dimensional planes of logic and memory, a first transistor plane is formed on a substrate. This transistor plane can be for any type of transistor or logic or memory. After forming the first transistor plane, polycrystalline silicon is deposited on the first transistor plane. However, polysilicon is not desirable as a material for epitaxial growth and transistor channel materials.

In 2D semiconductor fabrication, semiconductor films are grown epitaxially on semiconductor substrate wafers. For the case of epitaxial growth of a planar film atop a substrate wafer, the epitaxial film's lattice will have a specific orientation relative to the substrate wafer's crystalline lattice such as the [001] Miller index of the film aligning with the index of the substrate.

One solution is to convert the polycrystalline silicon, using a laser anneal process on upper base substrate planes, to single-crystal silicon. Then a subsequent transistor plane can be formed, capped with polycrystalline silicon and converted to single-crystal silicon. This pattern may be repeated for any number of transistor planes.

By way of an example, one CFET fabrication process uses a silicon substrate and epitaxially grows alternating layers of SiGe and Si up to 8 to 12 total layers. Limiting the height and/or number of layers in the epitaxial stack can be beneficial for better quality films. Then the SiGe is removed in the stack sandwich such that 4 to 6 layers of transistor planes are available to make logic as gate-all-around (GAA) field effect transistors. Two nanoplanes of transistors can be tied together to make an NMOS or PMOS device. However, this process only allows for a total of three actual transistor planes. In other words, a vertical stack of three field-effect transistors (FETs) is possible while keeping within quality specifications. Three levels of transistors, however, are insufficient to fully enable 3D logic formation for cost effective solutions. For volume scaling, more and more layers of transistors will be required. Techniques herein enable 3D planes of transistors to be at least greater than twenty planes or levels of high quality FETs. Each plane of transistors can be used to form any type of transistor including, but not limited to, CFET, planar, FinFET, and memory. Techniques herein can then be expanded as volume scaling increases.

Embodiments will now be described with reference to the figures. FIG. 1 is a cross-sectional schematic view of an example substrate segment herein. A silicon substrate or SOI (silicon-on-insulator) substrate 101 is received. A first transistor plane (circuit plane) 103 is fabricated on the substrate 101. This first plane 103 can include fully-formed field effect transistors (FETs) through metal layer 1 routing or this transistor plane 103 can include the layer(s) to form channels of transistor devices subsequently. The transistor plane 103 can be CFET devices, FinFet, Memory, Logic or any devices. Optionally, CFET planes are formed prior to etching an entire stack of a given transistor plane or of multiple, separated transistor planes. Accordingly, in a preferred embodiment, there is no restriction on epitaxial stack growth temperature. Each plane of silicon can be used for any type of transistor or memory element without restriction. In one embodiment, forming this first transistor plane 103 can include growing 8 to 12 layers of alternating SiGe/Si using an epitaxial growth process at temperatures as low as about 300 to 400° C.

After forming the first transistor plane 103, an insulator is deposited on the first transistor plane 103. This insulator can include a layer of silicon dioxide (oxide 105) formed on the first transistor plane 103. Other types of oxides or dielectric films can be selected. For most applications, an oxide 105 is deposited to a preferred thickness of 500 to 3000 Angstroms. FIG. 1 shows a layer of oxide 105 formed on the first transistor plane 103.

After the oxide layer 105 is formed, an etch mask 107 is formed thereon to open up VIA holes. The etch mask 107 can be formed of photoresist, and patterned with conventional exposure and development techniques. An etch operation is then executed that creates openings or holes 109 within the oxide layer 105, as illustrated in FIG. 1. These holes 109 can be via-like holes. In one embodiment, these openings or holes 109 are formed a predetermined depth into the oxide layer 105 without extending to the underlying transistor plane 103. For example, the etch depth can be 50% to 75% of an oxide film height (thickness of oxide layer 105). A diameter of holes 109 for a given substrate can depend on design objectives. By way of a non-limiting example, holes 109 in many embodiments can have a diameter from 75 nm to 175 nm. In one embodiment, the x and y spacing of the formed openings (holes) 109 can be approximately 4 microns to 10 microns, or preferably can be approximately 3 microns to 7 microns.

Figure 2:
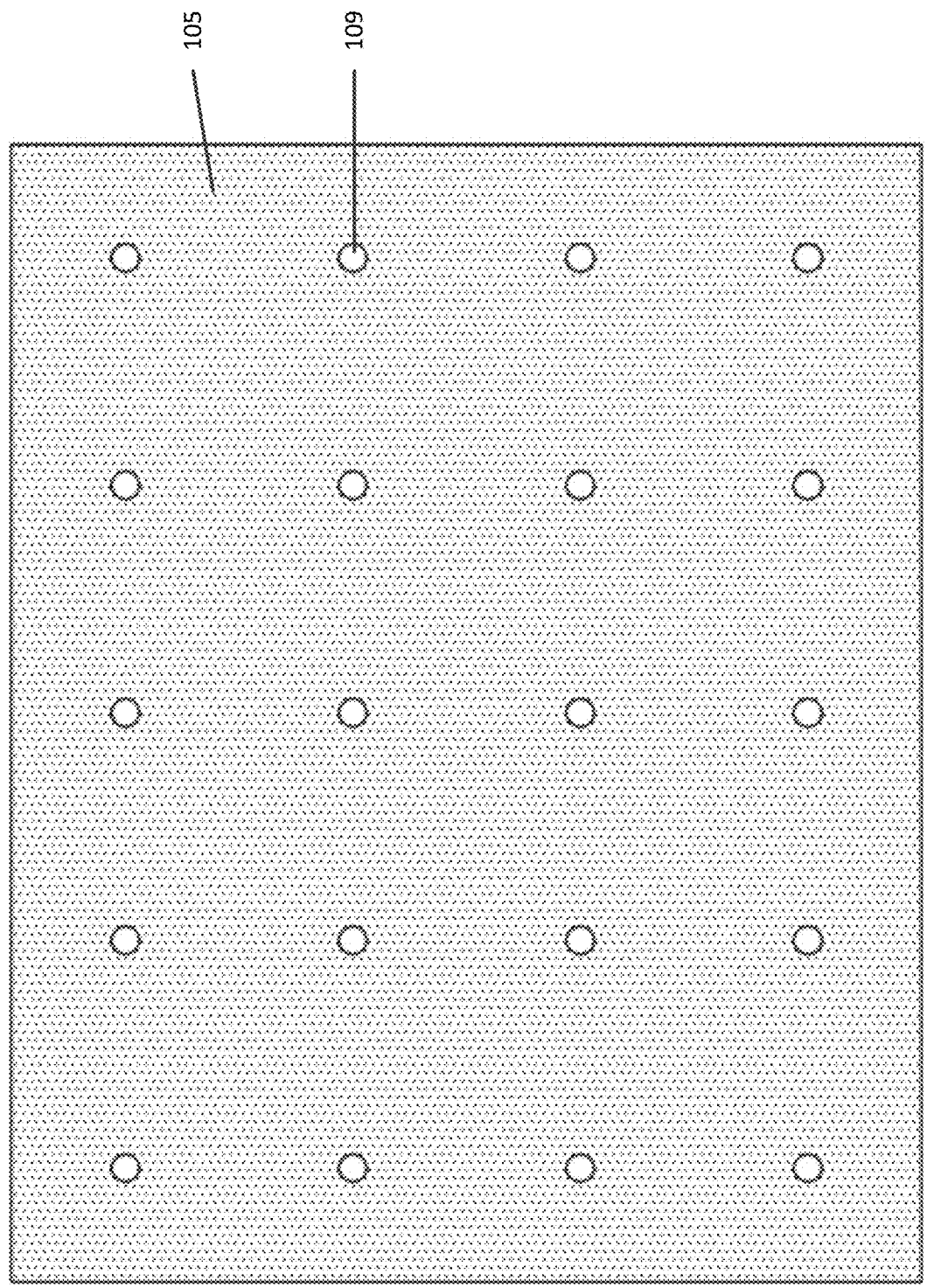
FIG. 2 illustrates a top view of an example substrate segment after forming holes in the insulator.

After etching the array of openings or holes 109, the etch mask is removed. A second oxide deposition step can be executed that creates a sloped contour in the sidewall of the holes 109. This sloped contour can be approximately 1 degree to 20 degrees or more. Note that a top of a hole 109 can be rounded from spacer-like deposition of insulator material. Depending on a particular thickness of a conformal spacer film, the hole 109 can be formed with a diameter that is larger than desired, because a conformal deposition can substantially narrow the hole 109 to a final circular contact hole. FIG. 2 illustrates a top view of an example substrate segment after forming holes 109 in the oxide 105. FIG. 2 is not to scale. Each hole 109 might be about 75 nm, while spacing between holes 109 might be about 7 microns.

Figure 3:
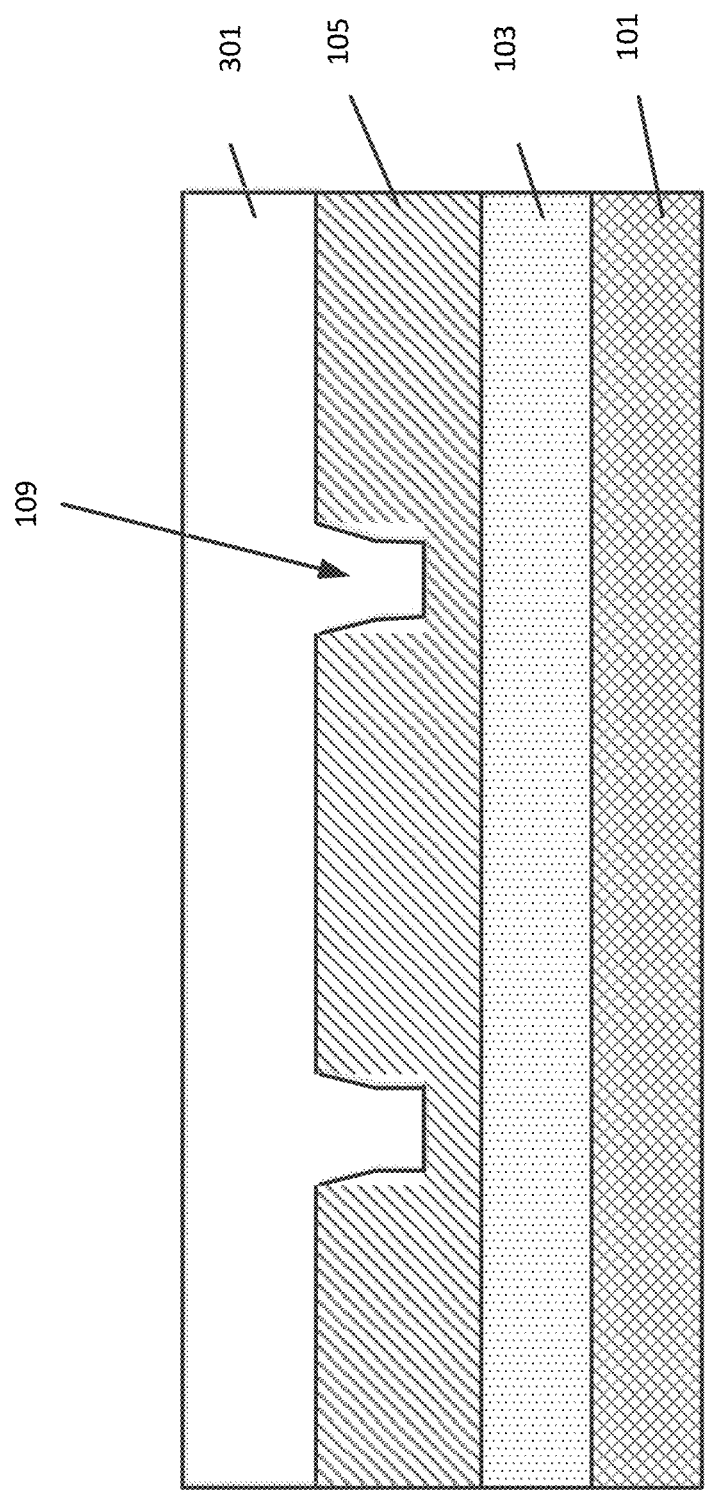
FIG. 3 illustrates the substrate segment after deposition of polysilicon.
Figure 4:
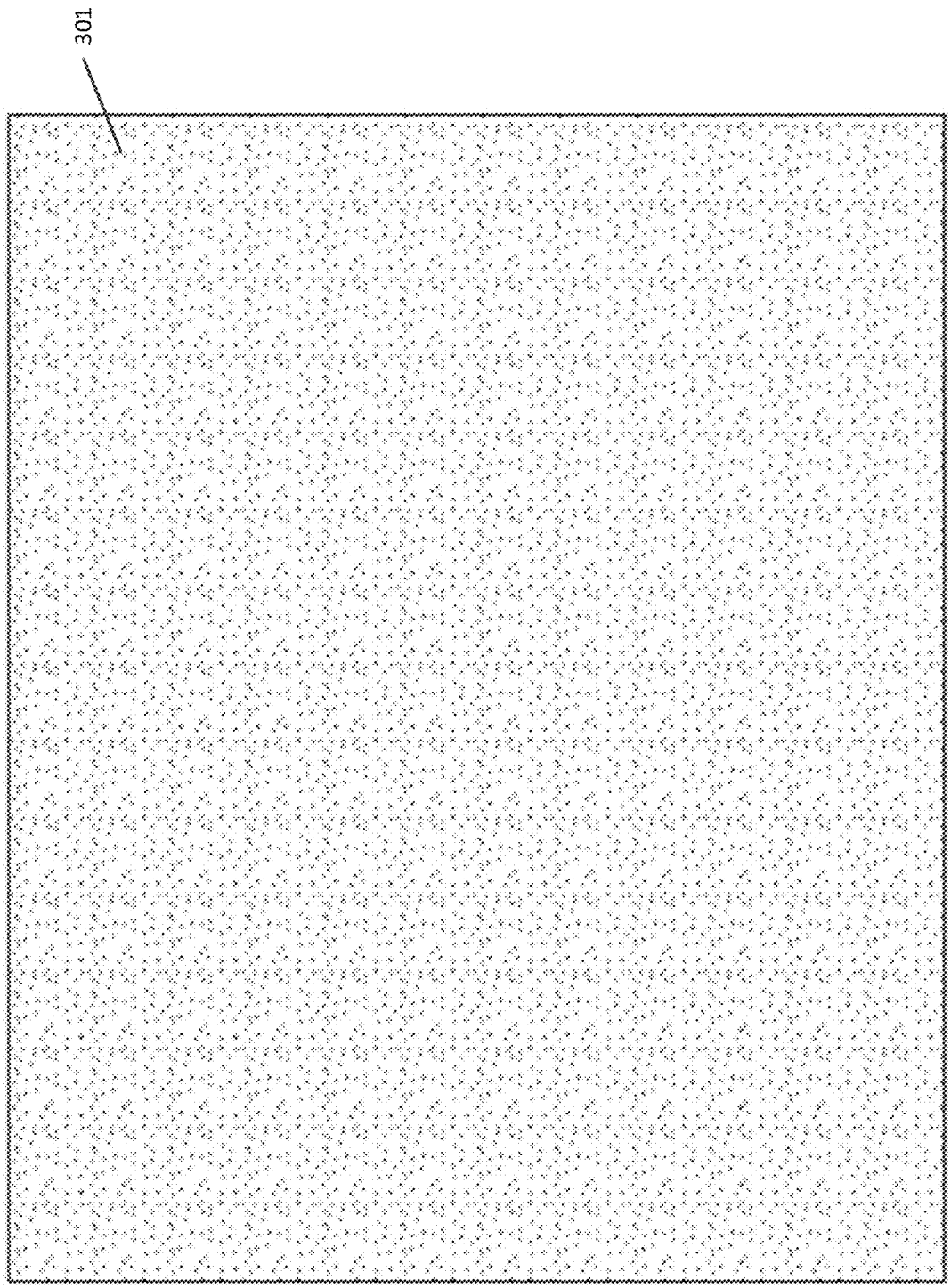
FIG. 4 illustrates a top view after deposition of polycrystalline silicon.

After formation of an array of holes 109 in the oxide 105, a layer of polycrystalline silicon (also referred to as polysilicon) 301 is deposited. Deposition temperature is preferably below 580 C. Deposition thickness can range from 500 to 3000 Angstroms. Polysilicon can be deposited using LPCVD (low-pressure chemical vapor deposition), PECVD (plasma-enhanced chemical vapor deposition), sputter deposition, or any polysilicon deposition method (even at room temperature). FIG. 3 illustrates the substrate segment after deposition of polysilicon. Note that the polysilicon 301 fills the holes and provides a generally planar surface on the substrate. FIG. 4 illustrates a top view after deposition of polycrystalline silicon 301.

At this point, a first transistor plane 103 has been formed and insulated. Holes 109 have been formed in the oxide layer 105, and polysilicon 301 is now on the working surface of the substrate. Polysilicon 301 fills the holes 109 and covers the oxide 105 providing a relatively planar surface. Polysilicon, however, is not appropriate as a material for epitaxial growth and transistor channel materials. Instead, monocrystalline silicon is needed in order to grow semiconductor films epitaxially.

Figure 5:
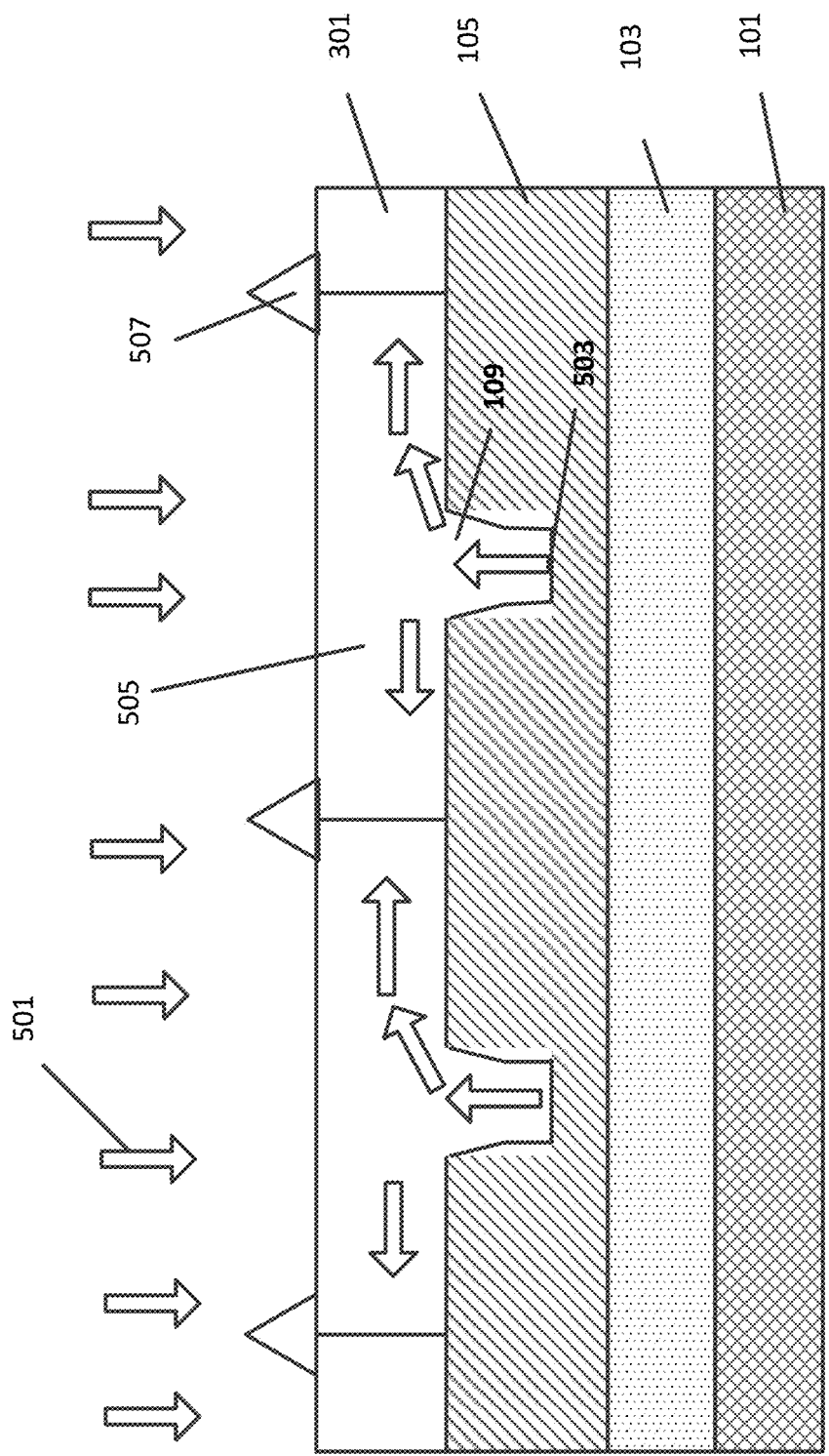
FIG. 5 illustrates laser annealing in which the contour of the holes helps direct formation of the polysilicon into single-crystal silicon.

With techniques herein, a scanning laser crystallization treatment is executed. This laser annealing process increases grain size of the polysilicon so that the resulting layer is single-crystal silicon. FIG. 5 illustrates laser annealing in which the sloped contour of the holes helps direct formation of the polysilicon into single-crystal silicon.

A scanning laser crystallization treatment using a laser beam 501 is applied to the polysilicon 301 which causes the polycrystalline grains to grow. In particular, a single crystal seed region 503 starts at a bottom of a Via hole 109 and grows upward to form a single-crystal silicon 505 located between grain edges 507. The single-crystal silicon 505 between grain edges may serve as epitaxial-like regions.

For the scanning laser crystallization treatment, any type of laser beam 501 can be selected for use. Example wavelengths for silicon treatment are typically 100 nm to 800 nm. Either the wafer can be held stationary and laser scanned across the wafer, or the laser can be fixed in position while the substrate (wafer) is rotated or moved through the laser. Such scanning motion allows for any type of laser system to be used. As can be appreciated, an amount of energy delivered, scanning rate, and laser system will depend on a given stack/area to be re-crystallized.

By way of a non-limiting specific example, a laser wavelength (l) and process conditions that rapidly heats silicon or polysilicon is a wavelength of 532 nm, pulse width of 10-15 ns, scanning speed of 14 to 45 cm/s, power 1 W to 7 W, and beam size of 2 to 3 mm by 40-80 um. Scanning time can be adjusted according to a thickness of a given polysilicon film or area to be scanned. Because the laser scans the polysilicon region 301 only, the laser is applied so that just this region will receive the energy (heating effect). Also, the laser is applied such that the layers, materials, and devices below the oxide layer 105 can remain less than 400 C. In other words, the heating amount and duration is targeted to the polysilicon layer 301 so that the underlying layers are not heated above a predetermined temperature.

The laser beam 501 melts the polysilicon 301, which then recrystallizes to a substantially larger grain size. In one embodiment, the laser beam 501 melts the polysilicon such that grain size increases are 4 to 10 times larger after laser treatment (with typical single crystal grains). Note that with advanced 3D CFET channels being on the order of 5 nm, the laser annealing technique herein may essentially achieve single crystal film properties by reforming grain size to be greater than 100 nanometers. As such, the majority of channels formed with recrystallized polysilicon will not have a single grain boundary. Additionally, with the laser beam being a coherent light source, there is no dispersion or significant spreading of the laser beam or loss of energy. Accordingly for channel scales on the order of single or double digit nanometers, the layer of polysilicon has grain size increased sufficiently to function as single crystal silicon for given channels.

For laser annealing, air can be used as a medium between the laser beam and the polysilicon layer to be annealed. Using air as the medium is convenient for wafer handling considerations. Note, however, that other mediums may be used. For example, the substrate can use an immersion in water or oil or other fluids because with a coherent laser light source many different Medias are available. In some embodiments, water or chilled water can be used. Using chilled water can be beneficial for substrate cooling because water has a relative high specific heat capacity. The use of other mediums (such as chilled water) can act as a cooling effect for the wafer substrate below the polysilicon 301. Accordingly, such chilling provides two benefits. A chilled medium enables protection of underlying transistor planes, and also serves to further augment grain size increases by enabling higher annealing temperatures.

Another embodiment herein uses cryogenic wafer chuck to obtain a maximum temperature gradient between the laser beam on the polysilicon layer being annealed and the silicon substrate. A wafer chuck is a device that is used to hold the wafer in place. Other embodiments use a variable temperature that spans temperatures from 400K (127 C) down to 30K (−243K) for a laser anneal system. Example coolants can include both liquid nitrogen and liquid helium with two cooling centerpoints (depending on the desired temperature window) thereby enabling effective wafer cycling. Laser scanning may also be limited to a particular region of a substrate, or an entire wafer surface.

Figure 6:
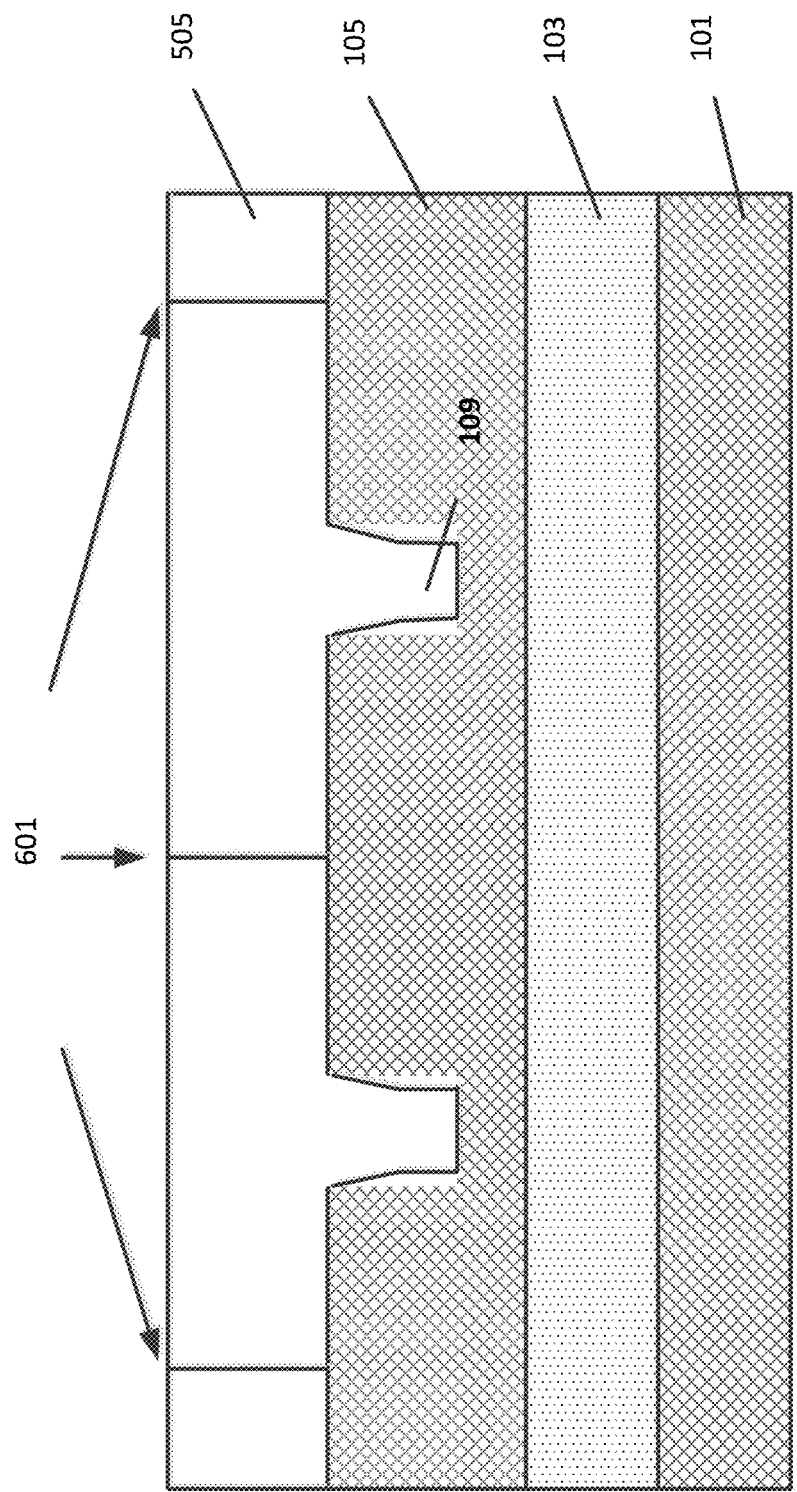
FIG. 6 illustrates an example result after polishing the layer of single-crystal silicon.

Following laser treatment, a polishing and/or planarization step can optionally be executed. FIG. 6 illustrates an example result after polishing the layer of single-crystal silicon 505. The polishing and/or planarization can be applied to single crystal epitaxial-like regions 505 between grain boundaries 601. For example, a CMP (chemical-mechanical polishing) step can be executed as one planarization option. A CMP step can modify single-crystal silicon channel regions to modify a now single-crystal silicon layer 505 (which includes a reduction in height of the epitaxial-like region). Planarization/polishing are beneficial because surface roughness after laser anneal can be higher. This roughness can be reduced by an order of magnitude following CMP and cleaning steps, thereby thinning the layer of annealed polysilicon 505. Example cleaning treatments can include (1) immersing the CMP polished poly-Si film into two mixture solutions (NH4OH:H2O2:H2O=1:4:20 and HCl:H2O2:H2O=1:1:6) at 75° C. for 10 minutes to remove most of the residuals from CMP; (2) immersing the substrate into pure H2O2 for 10 minutes to form sacrificial oxide on the poly-Si surface, and (3) removing the sacrificial oxide using dilute HF solution (HF:H2O=1:10) for 5 minutes.

Alternatively, roughness of the single-crystal silicon 505 can be reduced by oxidation or silicon etching, or combinations of CMP, oxidation or etching.

Figure 7:
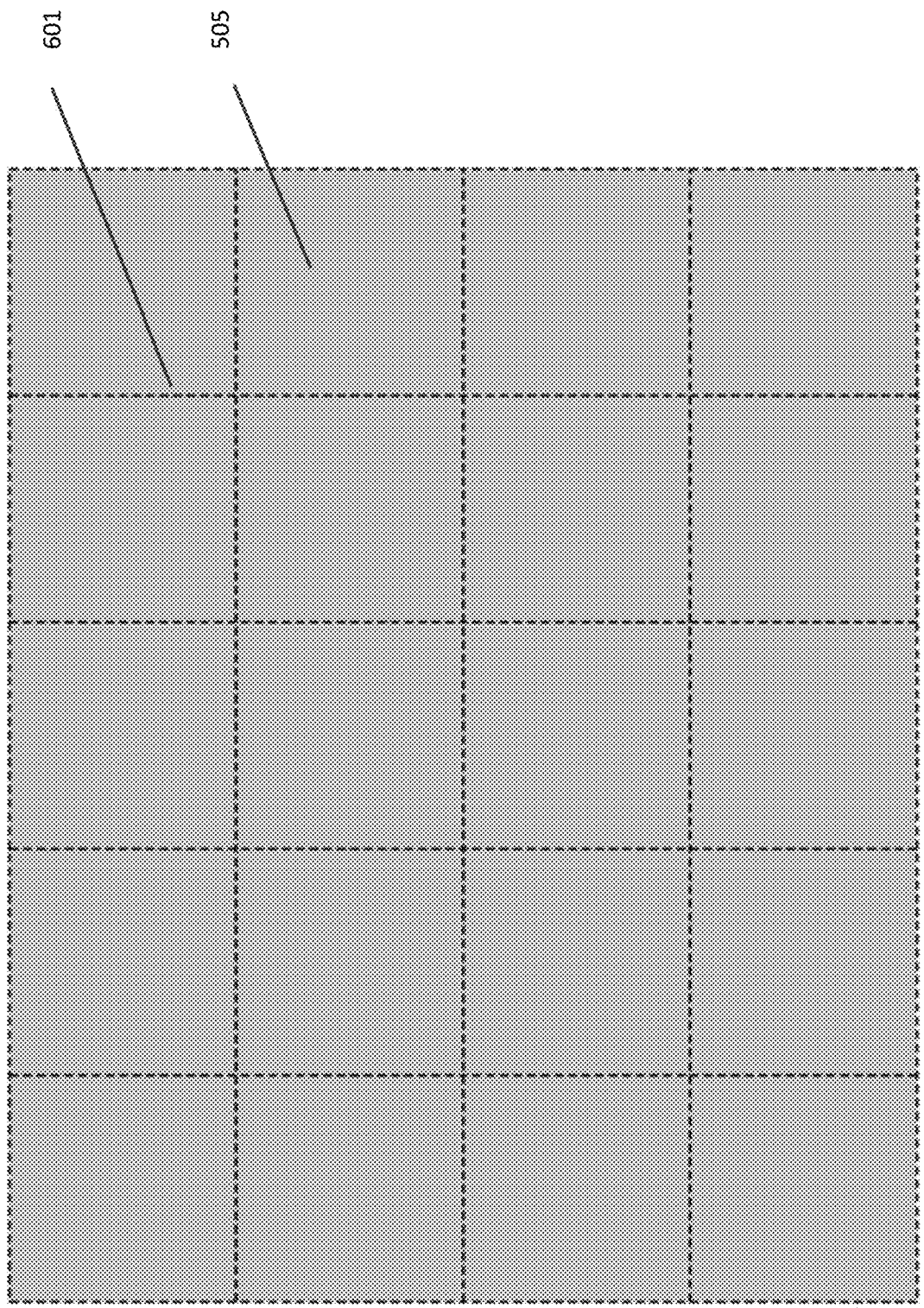
FIG. 7 illustrates a top view of the substrate segment after polishing the layer of single-crystal silicon.

FIG. 7 illustrates a top view of the substrate segment after polishing the layer of single-crystal silicon. FIG. 7 includes dashed lines marking where grain boundaries 601 fall. Grain boundaries 601 can form at points that are equidistant from adjacent holes. In other words, hole placement can direct where grain boundaries form. This can result in rectangular pads of silicon.

Figure 8:
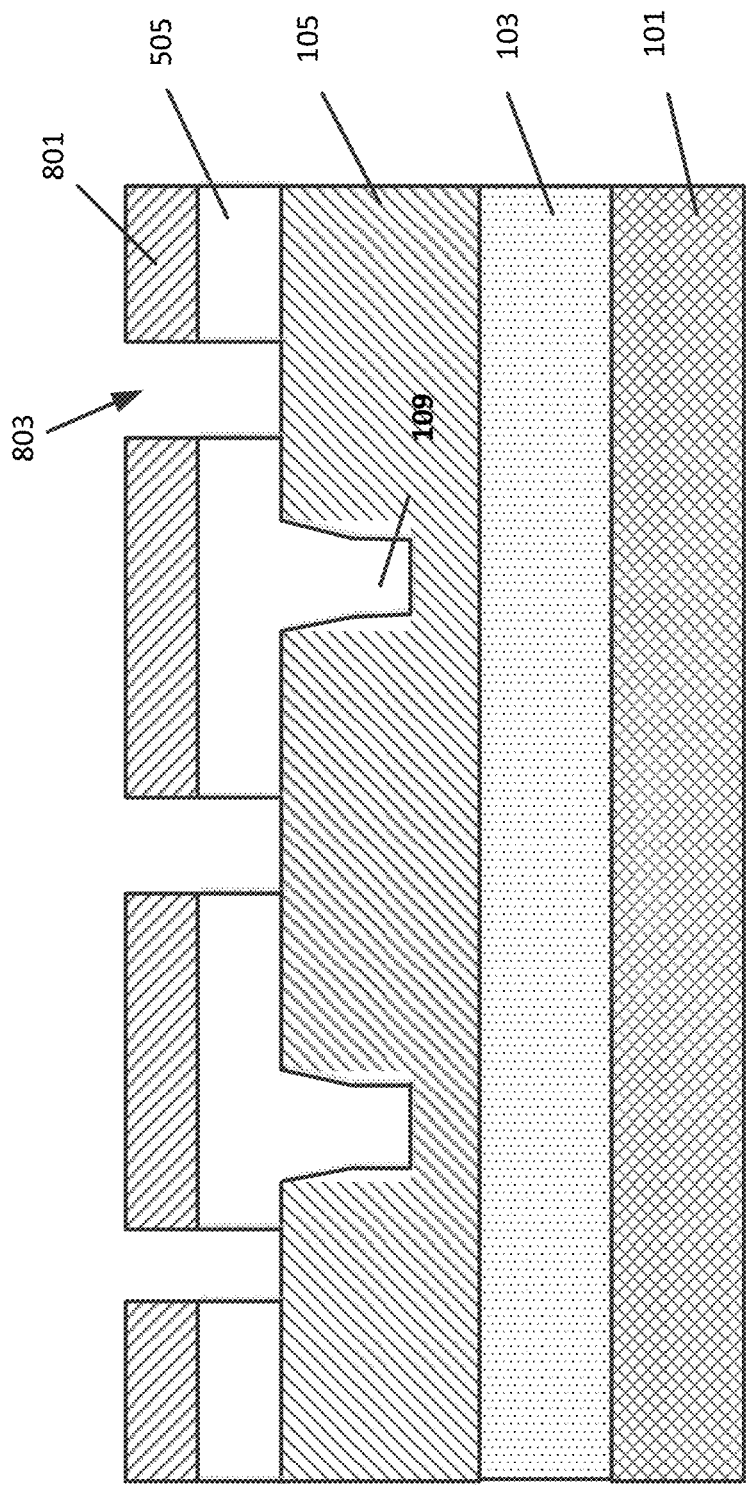
FIG. 8 illustrates an example result after removal of grain boundaries.

Grain boundaries 601 at the edge of a given 7 um×7 um (or other dimension) can be relatively large, and removing this grain boundary can be beneficial. FIG. 8 illustrates an example result after removal of grain boundaries. As an example, an etch mask 801 can be formed to remove grain boundaries. The etch mask 801 can define openings uncovering grain boundaries, which can then be removed using a reactive ion etch process to form trenches 803.

Figure 9:
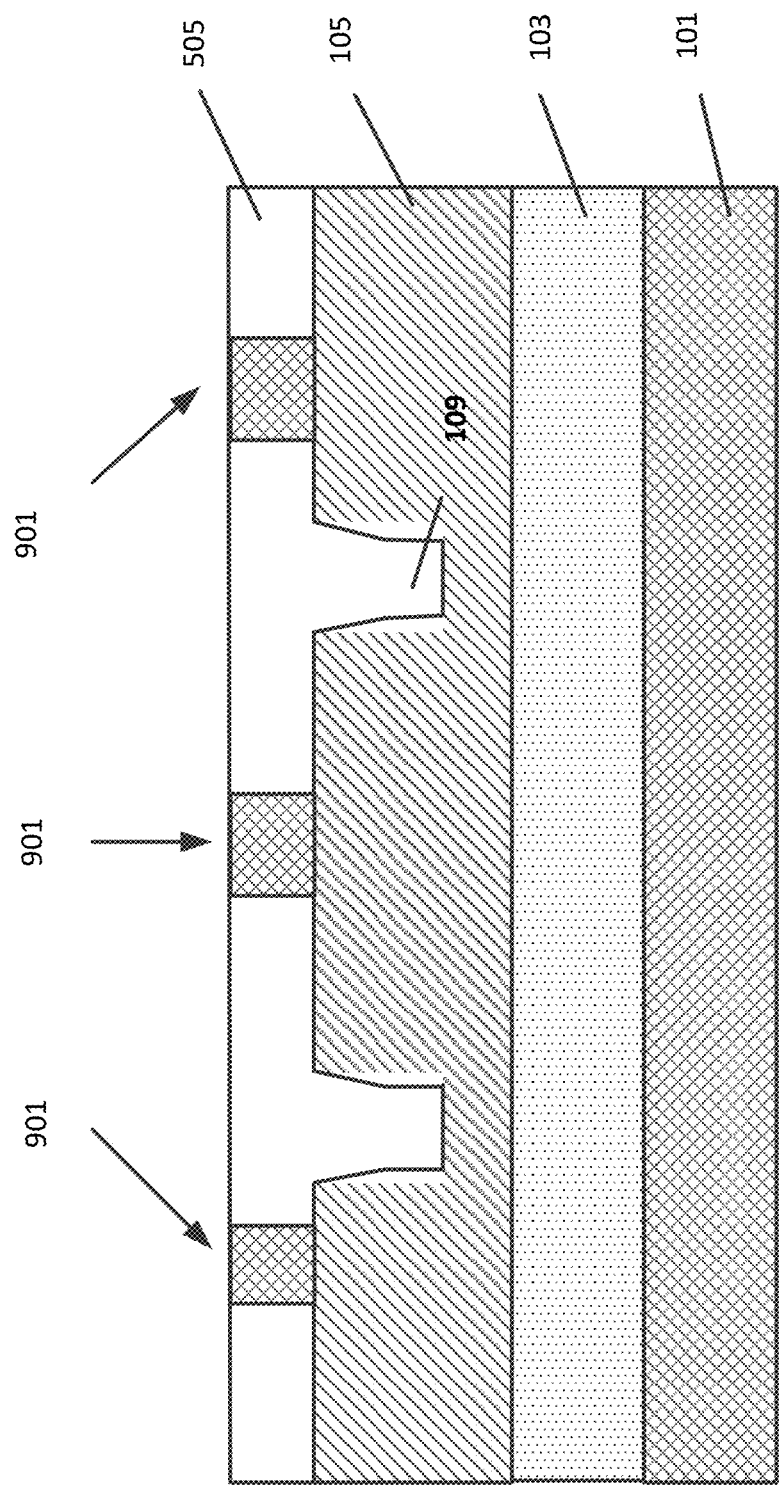
FIG. 9 illustrates grain boundaries having been replaced with an insulator material.

FIG. 9 illustrates grain boundaries having been replaced with an insulator material. Trenches resulting from etching out grain boundaries can then be replaced with a dielectric film 901, such as an oxide. This can be accomplished by an initial deposition that results in an overcoat, followed by a planarization step to remove the overburden. In another embodiment, grain boundaries can be removed prior to planarization of the laser-annealed polysilicon. Trenches at grain boundaries are then filled, and a CMP step is used to both remove an overburden of dielectric film and remove roughness from the laser anneal.

Figure 10:
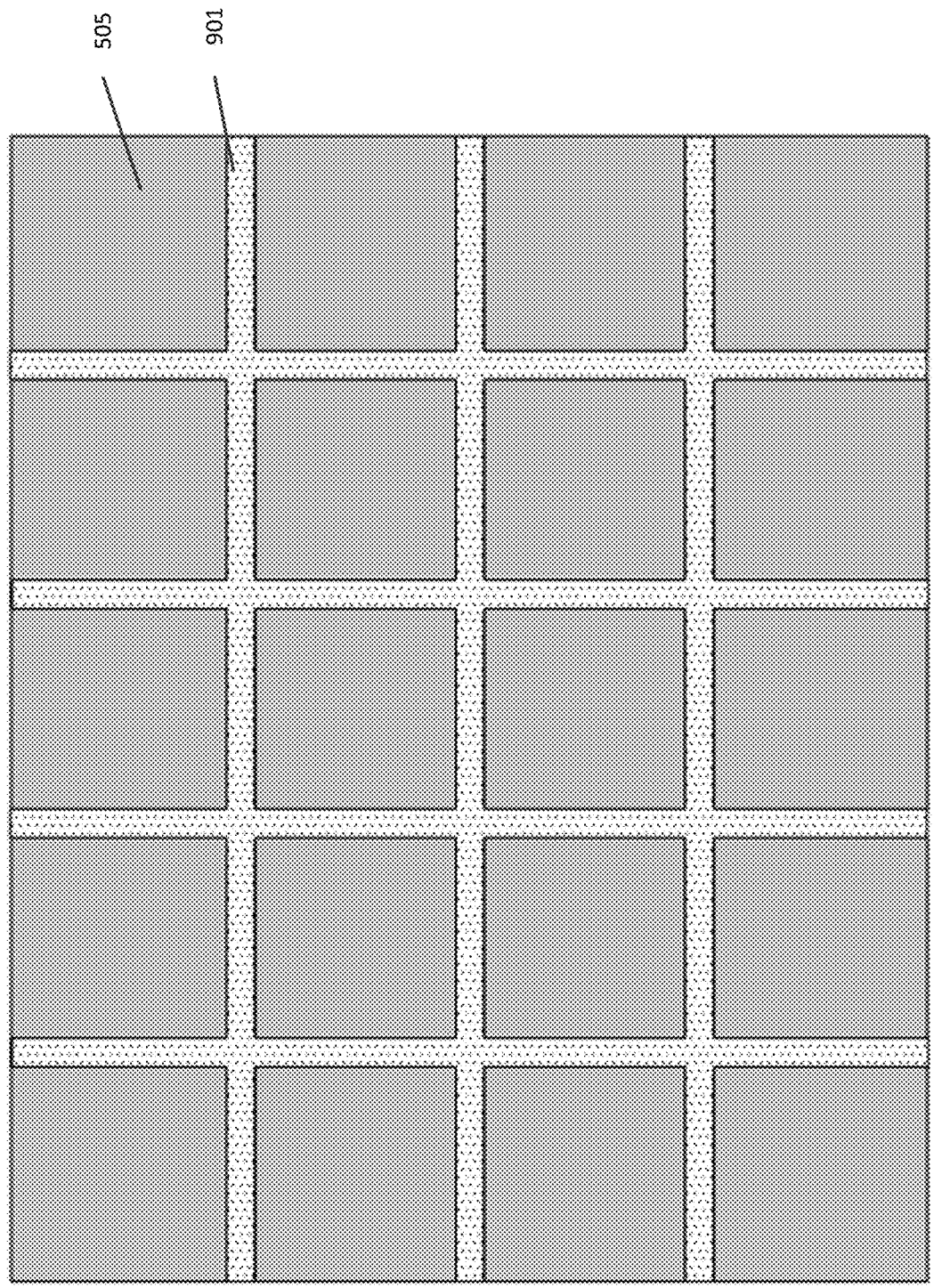
FIG. 10 illustrates an example top view of the substrate segment after replacing grain boundaries with dielectric material.

FIG. 10 shows an example top view of the substrate segment after replacing grain boundaries with dielectric material 901. The result is an array of relatively large pads of single-crystal silicon 505 formed over an existing plane of field-effect transistors 103.

Figure 11:
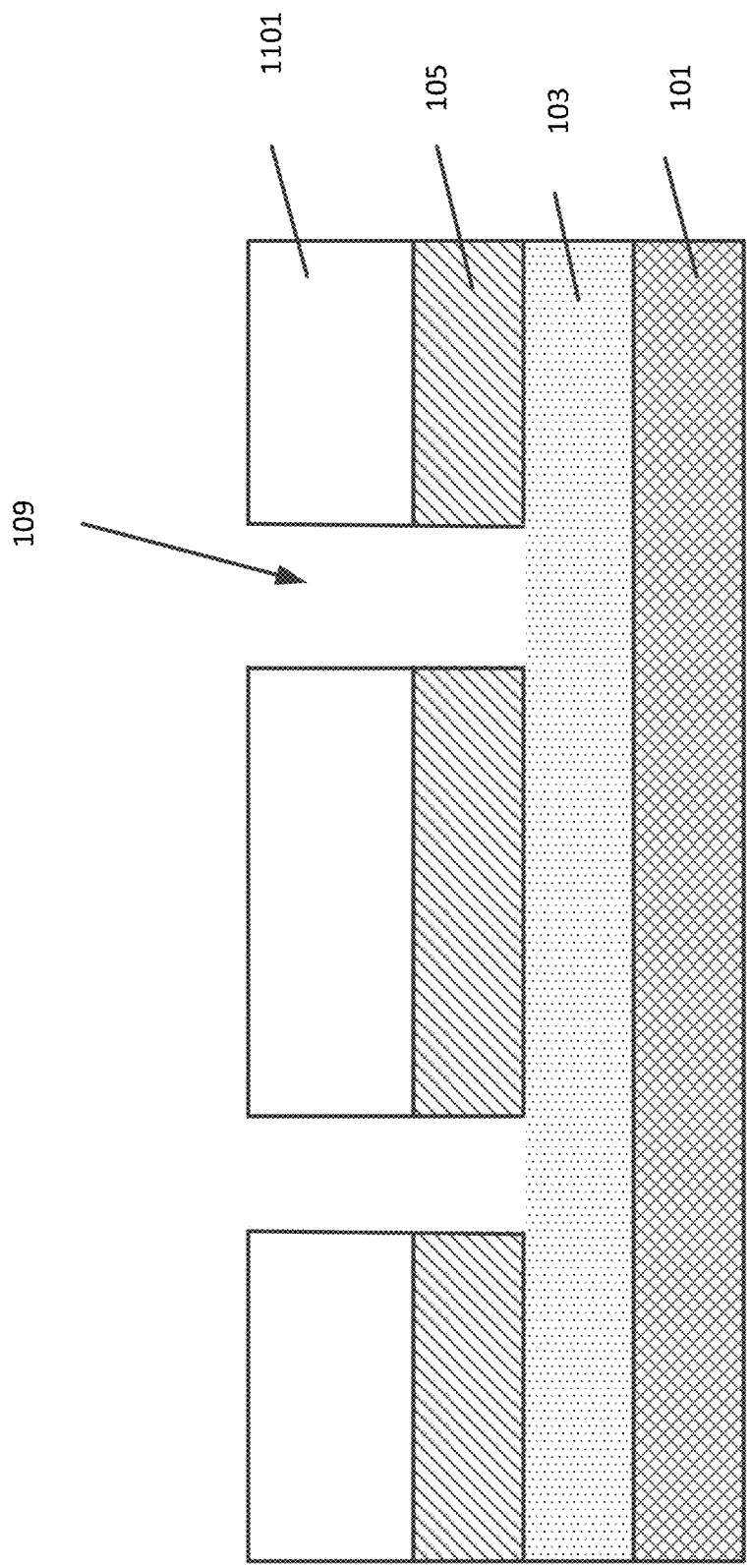
FIG. 11 illustrates forming holes that extend completely through the oxide layer instead of partially into the oxide layer.

Another embodiment herein includes a process of making upper substrate planes using the silicon substrate 101 (or first transistor plane 103 as an upper substrate) as a seed layer (this makes the upper plane crystal same as substrate, i.e. a (100) substrate produces a (100) orientation for upper plane, while a (110) substrate produces a 110 crystal orientation. In this embodiment, holes 109 formed in the insulator layer extend all the way through the oxide layer 105, uncovering a top surface of the underlying silicon of the first transistor plane 103. Then when laser crystallization is completed, the substrate seed (uncovered top layer of silicon) provides the crystal orientation of the single crystal silicon formed by annealing polysilicon. FIG. 11 illustrates forming holes that extend completely through the oxide layer 105 instead of partially into the oxide layer 105. These holes 109 can be contoured/sloped as described above.

Figure 12:
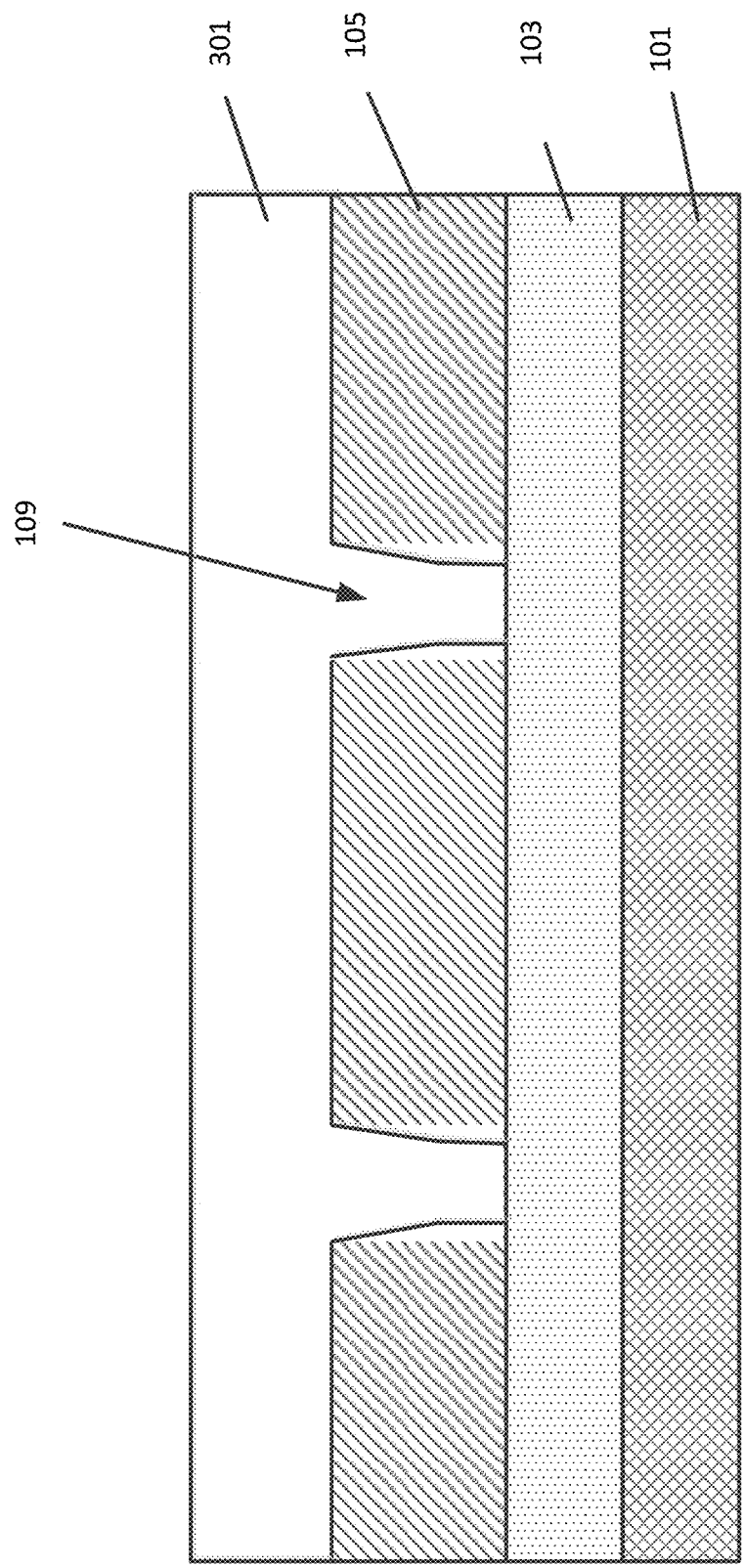
FIG. 12 illustrates depositing polycrystalline silicon on the substrate.
Figure 13:
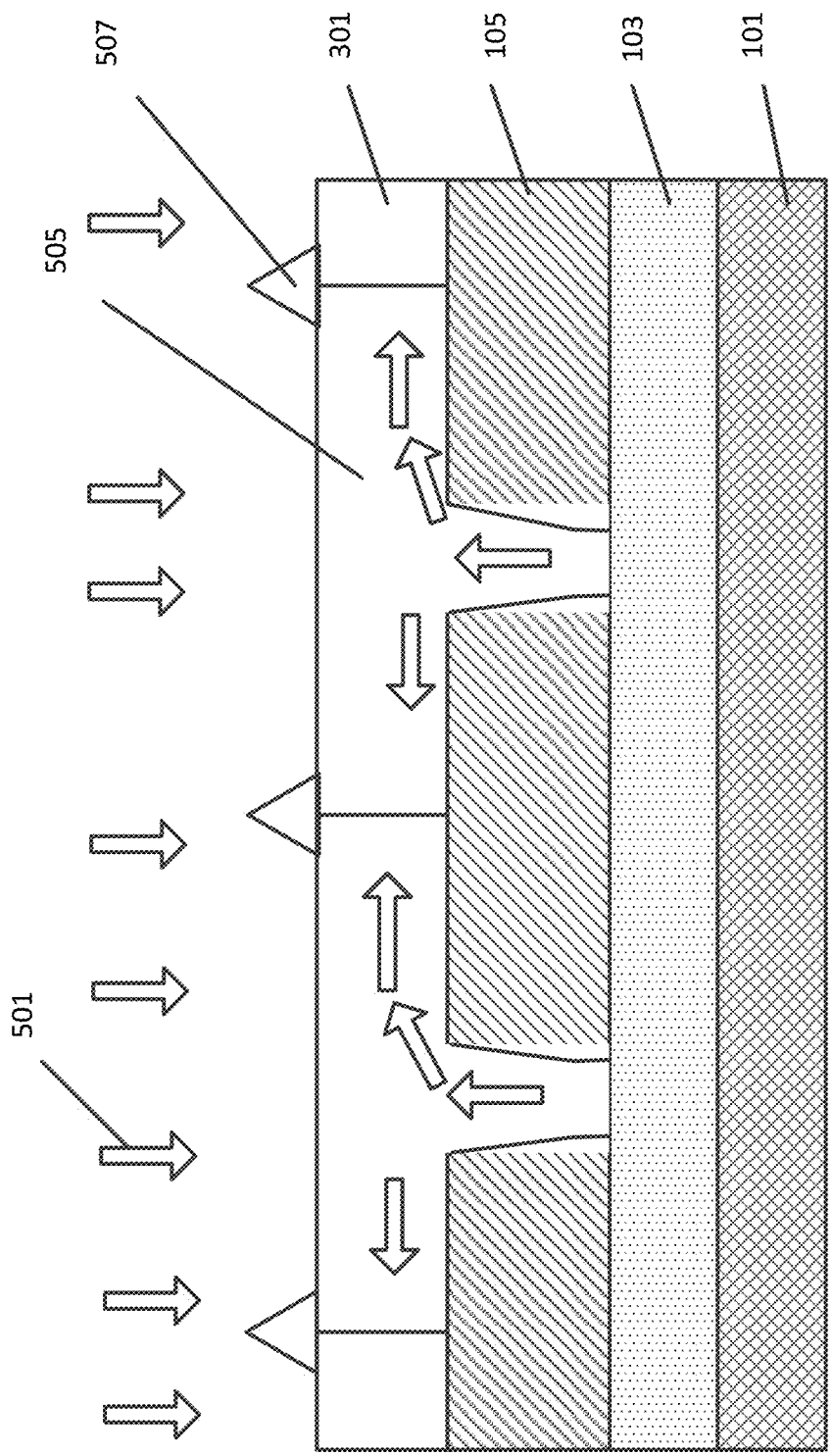
FIG. 13 illustrates annealing the layer of polycrystalline silicon using laser heating.
Figure 14:
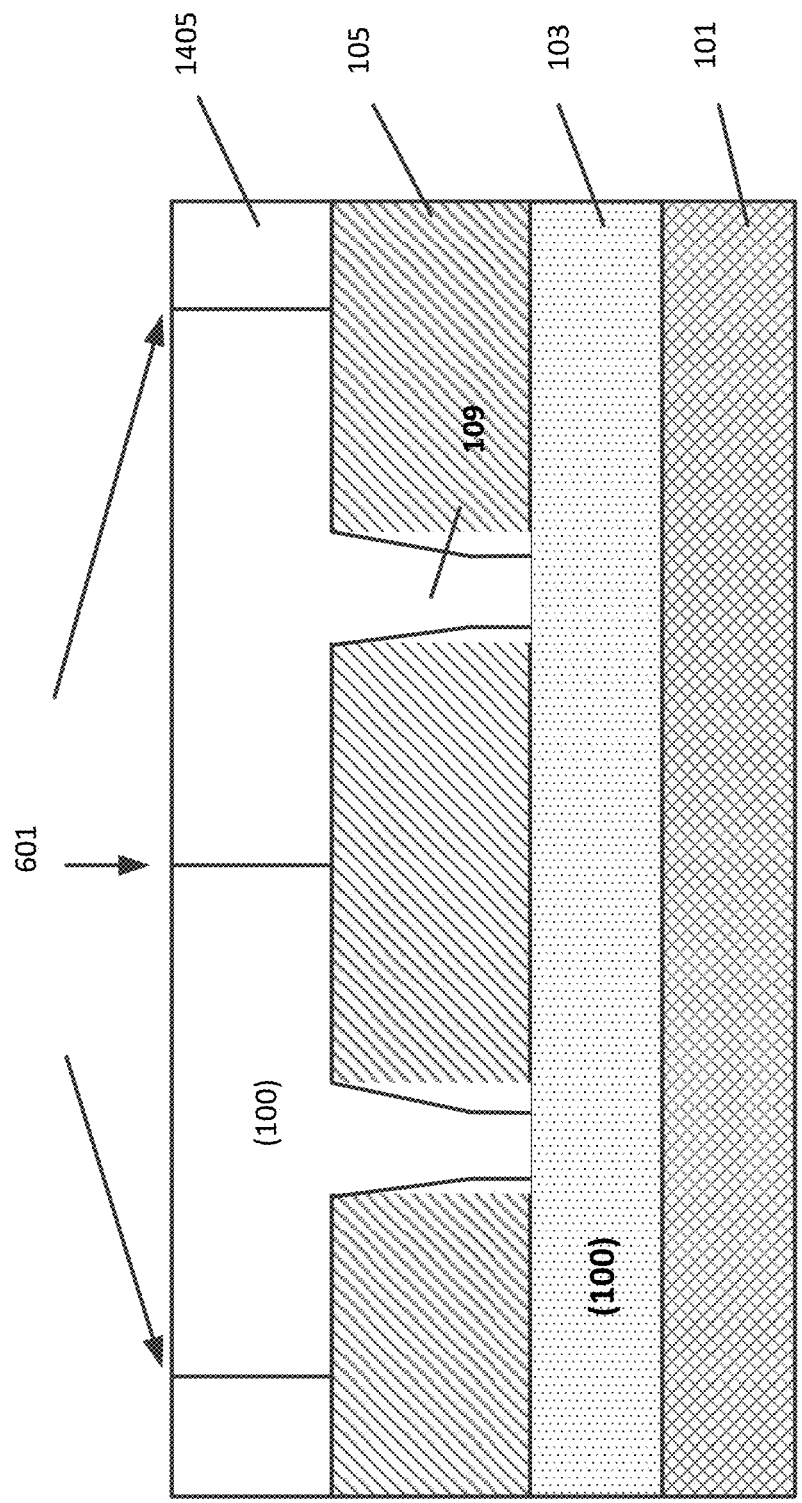
FIG. 14 illustrates resulting single-crystal silicon with a plane crystal orientation.

FIG. 12 illustrates depositing polycrystalline silicon on the substrate. The layer of polycrystalline silicon 301 is deposited, contacting the top surface of the first transistor plane 103, filling the holes 109, and covering the oxide layer 105. Then, as illustrated in FIG. 13, the polycrystalline silicon 301 is annealed using laser heating as previously described. This results in the top layer of the first transistor plane 103 directing crystal formation, because the uncovered silicon functions as a seed layer 1303. Subsequently, as illustrated in FIG. 14, if the first transistor plane 103 has a 100 plane crystal orientation, then resulting single-crystal silicon 1405 will have a 100 plane crystal orientation.

Figure 15:
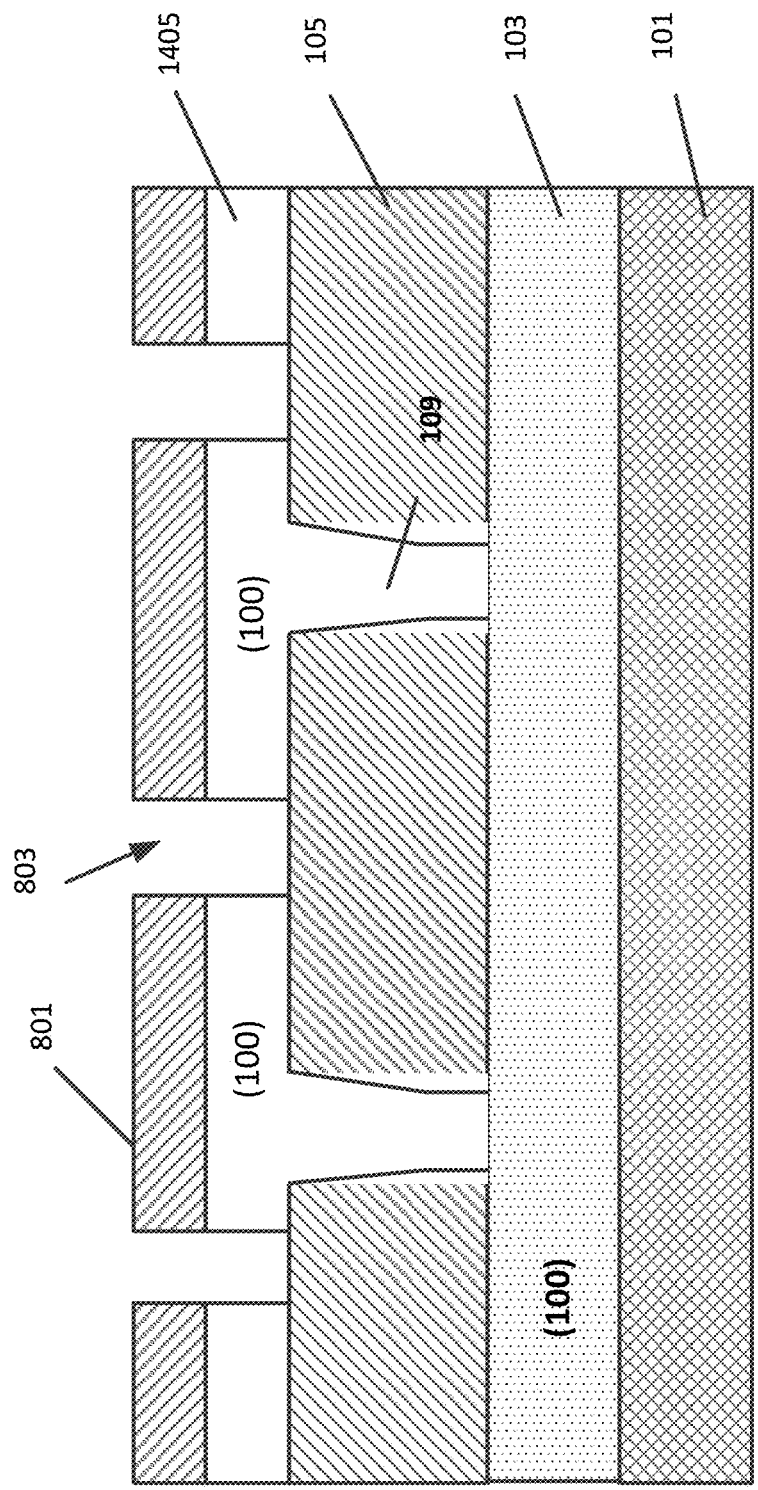
FIG. 15 illustrates removing grain boundaries by etching.

As illustrated in FIG. 15, grain boundaries 601 are removed by etching. As in FIG. 8 above, an etch mask 801 can be formed to remove grain boundaries. The etch mask 801 can define openings uncovering grain boundaries, which can then be removed using a reactive ion etch process to form trenches 803.

Figure 16:
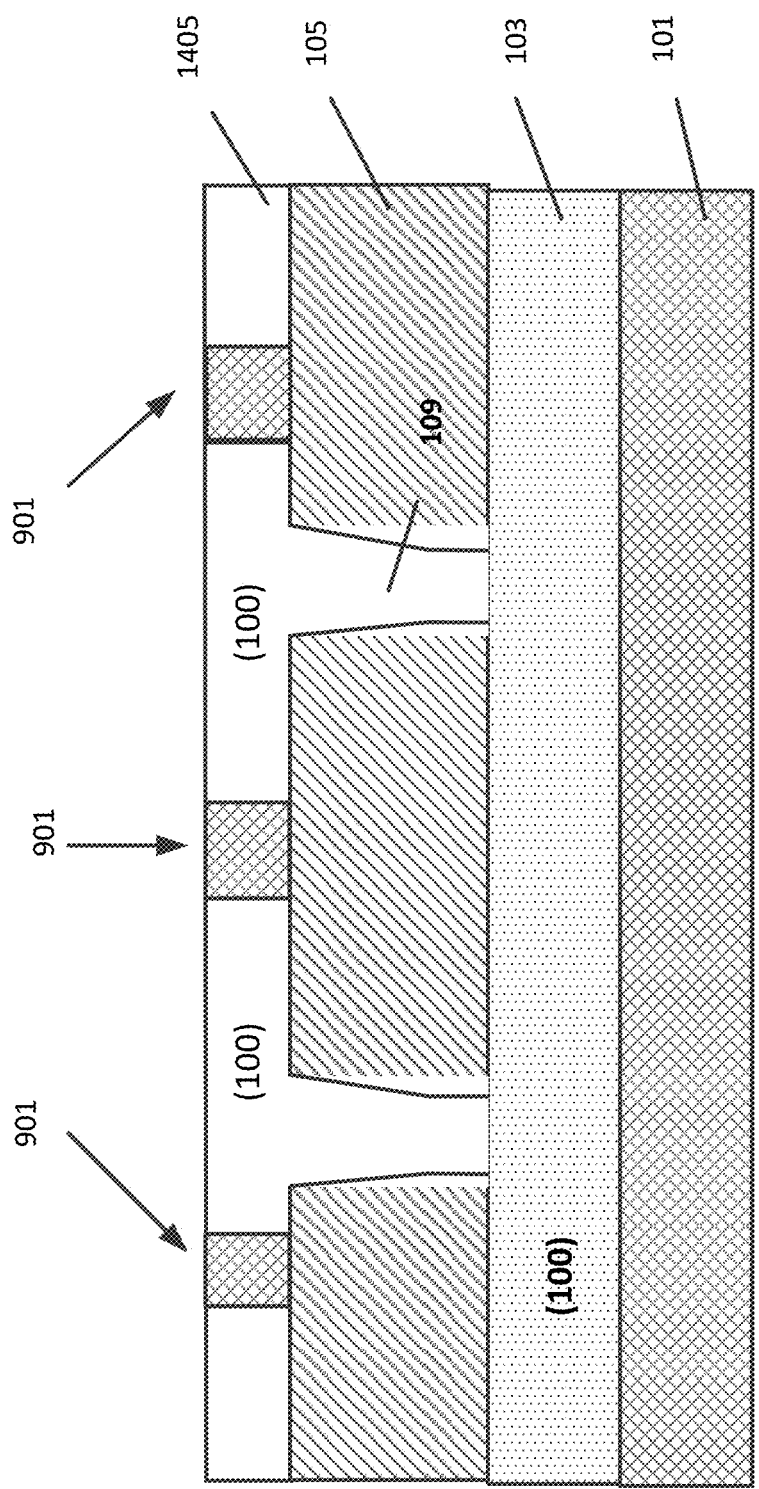
FIG. 16 illustrates filling removed grain boundaries with a dielectric/insulator material.

As illustrated in FIG. 16, removed grain boundaries are then filled with a dielectric/insulator material 901.

Figure 17:
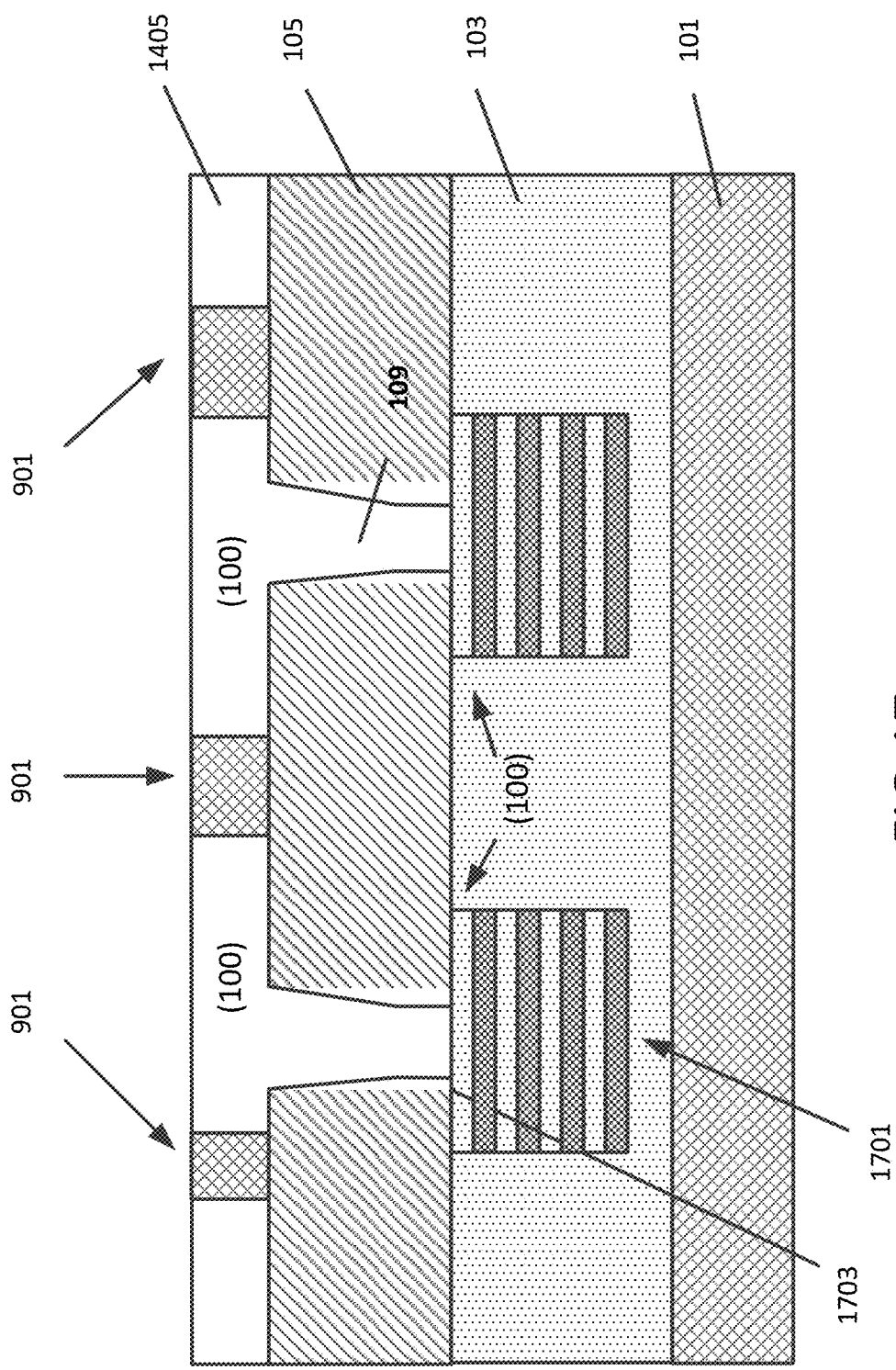
FIG. 17 illustrates an example cross-section including nanostacks.

In some embodiments, nanostacks of epitaxy growth can be formed or left at specified locations to be accessed as seed material for holes. FIG. 17 illustrates an example cross-section including nanostacks. Each nanostack 1701 can have a top silicon layer 1703 with a desired crystal plane orientation for particular coordinate locations on the substrate. The top silicon layer 1703 of the nanostack 1701 serves as a silicon seed.

Figure 18:
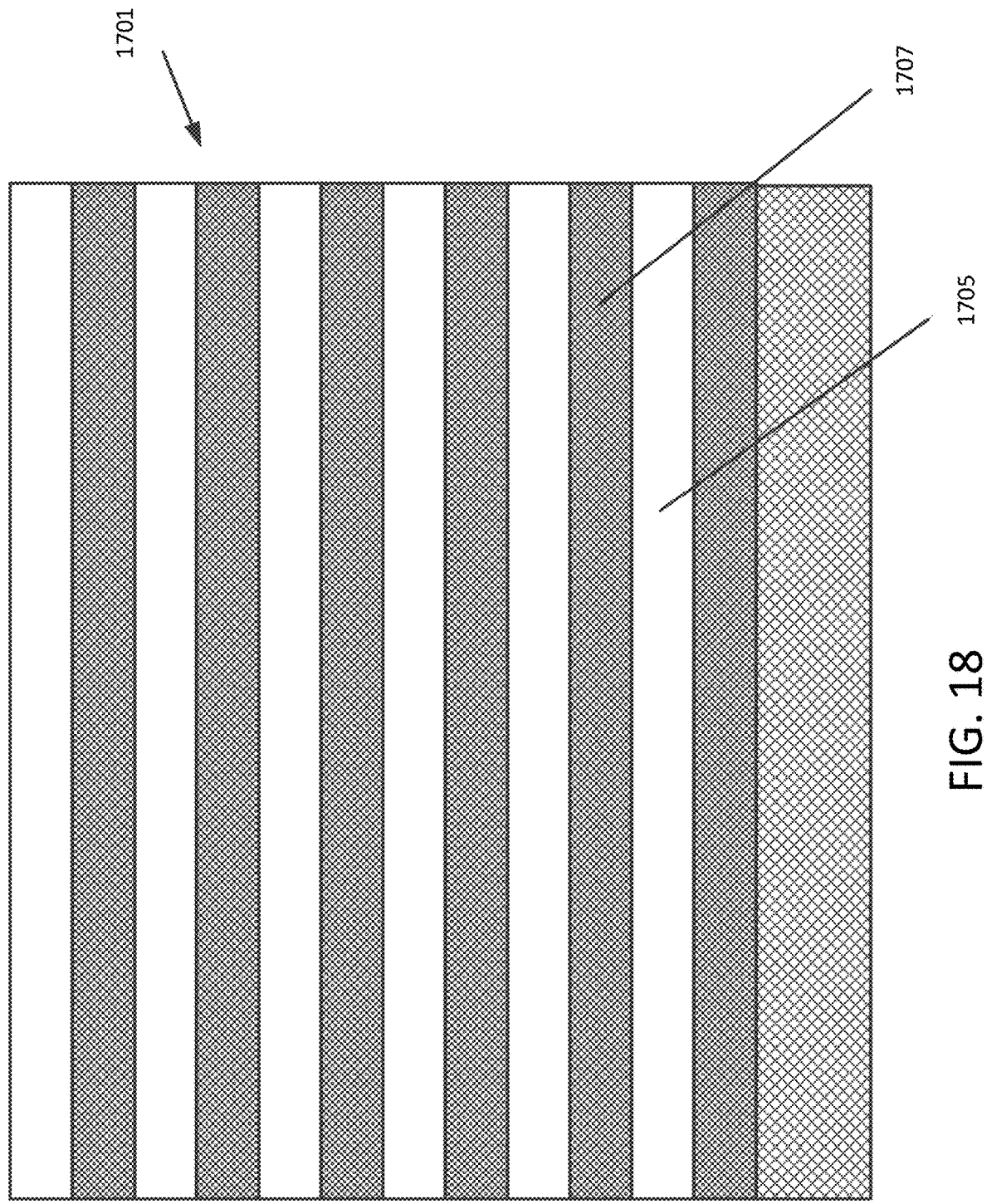
FIG. 18 illustrates what an example composition of a given nanostack, which can include alternating layer of silicon and silicon-germanium.

FIG. 18 illustrates what an example composition of a given nanostack 1701, which can include alternating layer of silicon 1705 and silicon-germanium 1707. Regarding FIG. 18, six Si epitaxial grown stacks may be grown from the Si substrate and six SiGe epitaxial grown stacks may be grown from the Si substrate, which is a maximum number possible per silicon plane. If this is replicated over four silicon planes, 48 SiGe/Si nanostack planes are possible (or 24 silicon planes for 3D integration).

Another embodiment herein is metal-induced crystallization. In this embodiment, a method of making single crystal silicon with a preferred orientation can be performed without using an epitaxial-like stack or substrate as a silicon seed layer. The same polysilicon laser anneal is used, with an additional metal induced crystallization step. This embodiment uses a deposited metal seed on top of the polysilicon region to be converted to single-crystal silicon with a preferred crystal orientation. By using a metal induced crystallization step, the preferred crystal orientation can be the same or different than an underlying silicon plane. The extra metal silicon crystal process is used with holes that extend only partially into the insulator layer without extending completely through the insulator layer. Holes that are formed by etching partially into the oxide can be beneficial to leave a layer of oxide to protect underlying transistors. However, for each hole to become polycrystalline silicon of a desired orientation, seed material needs to be formed.

Certain metals can assist with directing crystal orientation. Example metals include Pt, Ni, Cu, Au, and Al. When these metals are deposited on polycrystalline silicon in certain geometries and heated from 1 to 4 hours with temperatures from 200 C to 600 C, the result is a greatly enhanced grain growth that can produce silicon seeds for subsequent re-crystallization of polysilicon grains for making preferred crystal orientations for single crystal silicon. For example, nickel (Ni) is a useful metal selection because Ni can go up to 600 C.

As described above, a substrate 101 is received, with a first transistor plane 103 of field effect transistors. An oxide layer 105 is deposited thereon. Holes (openings) 109 are formed that extend partially into the oxide layer 105. These holes 109 can be contoured/sloped as described above. A layer of polycrystalline silicon 301 is formed thereon.

Figure 19:
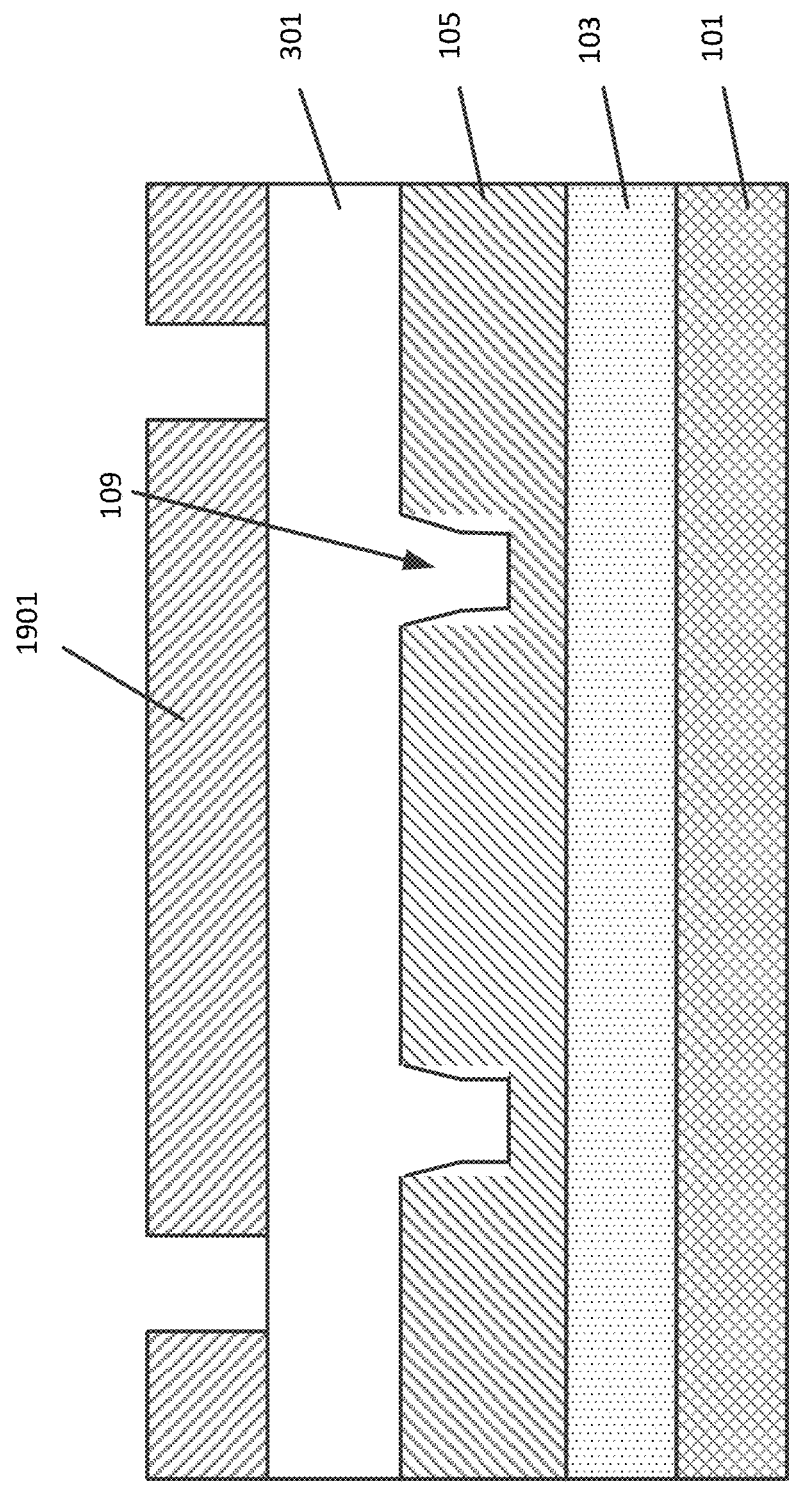
FIG. 19 illustrates a relief pattern on the layer of polysilicon.

A relief pattern 1901 is then formed on the layer of polysilicon. FIG. 19 illustrates a relief pattern on the layer of polysilicon. The relief pattern 1901 controls a size and shape of metal in contact with the layer of polysilicon 301. The relief pattern 1901 is of dielectric material.

Figure 20:
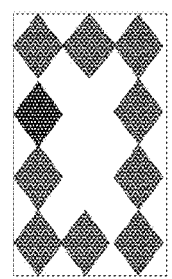
FIG. 20 illustrates depositing a first metal on the substrate.
Figure 20:
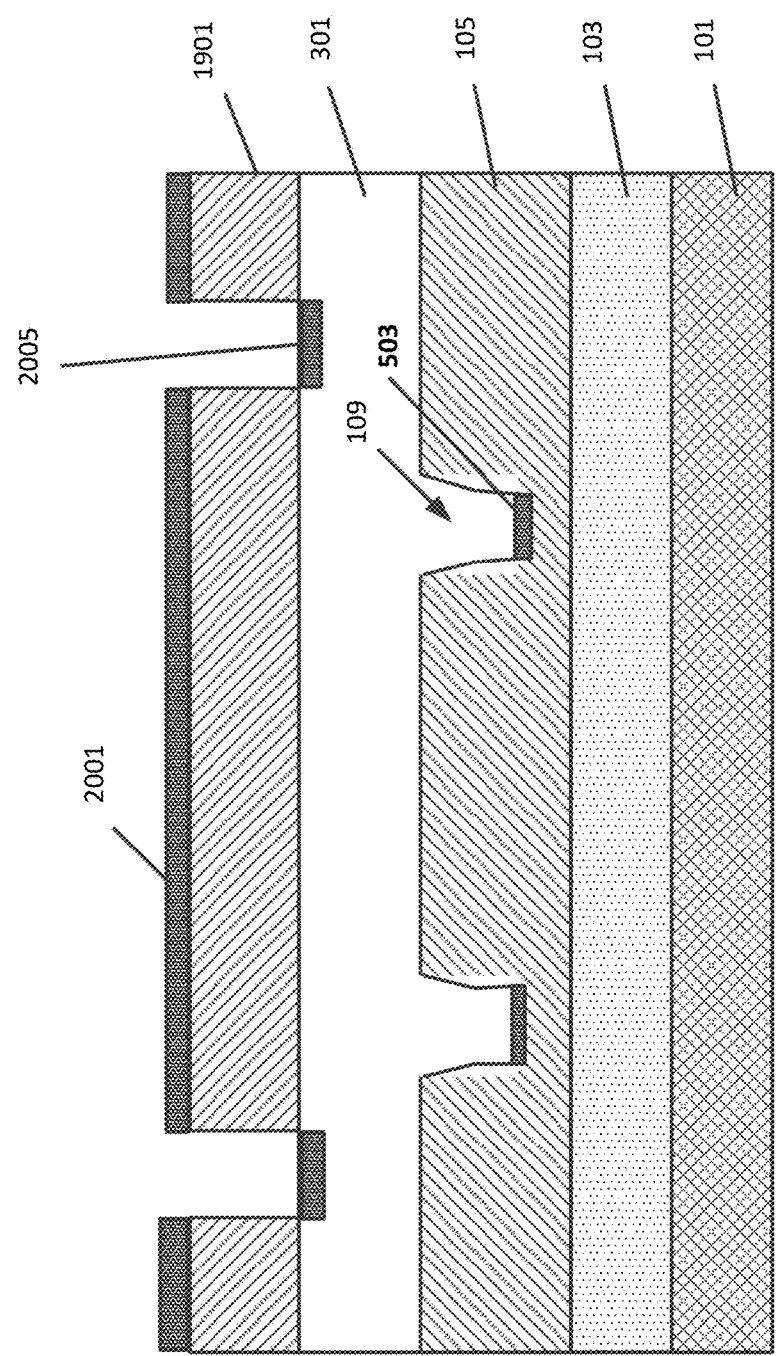

As illustrated in FIG. 20, a first metal 2001 is deposited on the substrate. Note from a top down view of openings 2003 that openings can have a particular geometry, such as jagged lines, to help direct formation of a particular crystal orientation. A thickness of metal 2001 (such as nickel) can be deposited 50 A to 300 A (more or less). The substrate is then annealed. This can include a bake step of two to four hours at 400 C to 600 C. The metal induced crystallization growth process can produce either or both (100) or (110) single crystal silicon seeds depending on the deposited geometry of the Nickel prior to metal anneal step. For the (100) silicon orientation a line with a zigzag pattern or jagged edge is deposited, while for the (110) orientation a rectangular Ni metal pattern can be formed. Then, the metal 2001 is removed and polysilicon 301 polished to form a Via (hole) seed mandrel 2005 of silicon. The low temperature anneal places seeds 503 at the base of Via hole 109 filled with polycrystalline silicon.

Figure 21:
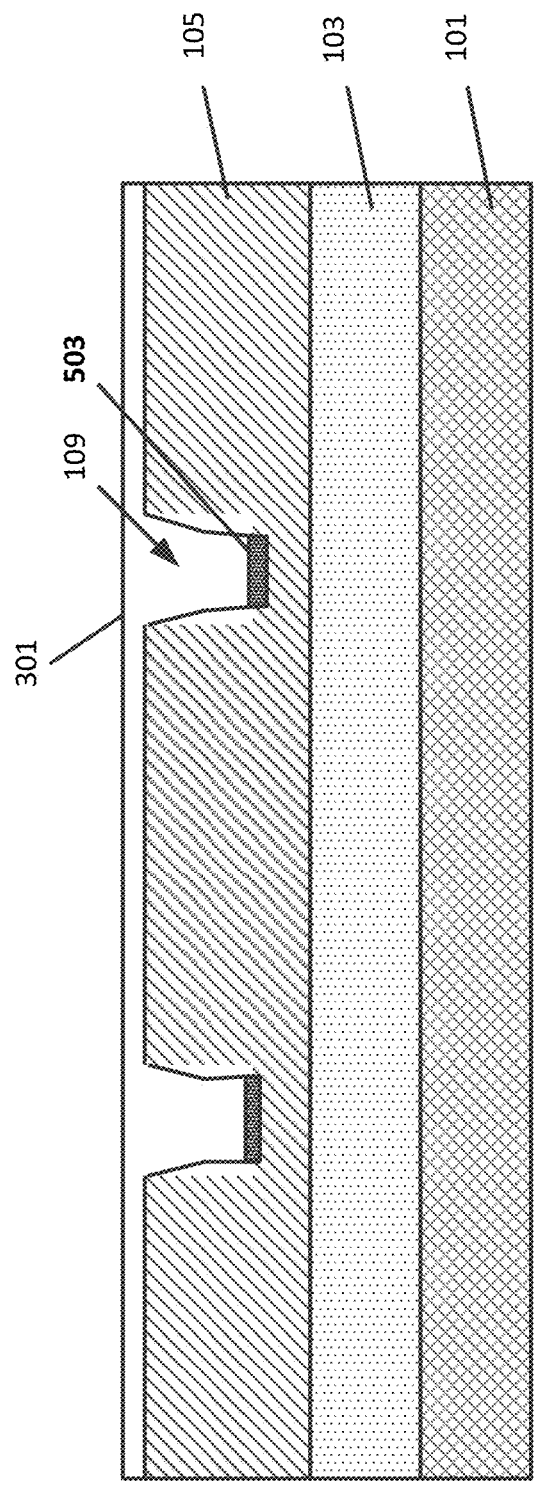
FIG. 21 illustrates an example result after removing the relief pattern, the deposited metal, and the polysilicon.

The substrate is then planarized down to the first oxide layer 105. This includes removing the relief pattern 1901, all deposited metal 2001, and the first layer of polysilicon 301, except for polysilicon filling holes 109. An example result of planarizing is shown in FIG. 21.

Figure 22:
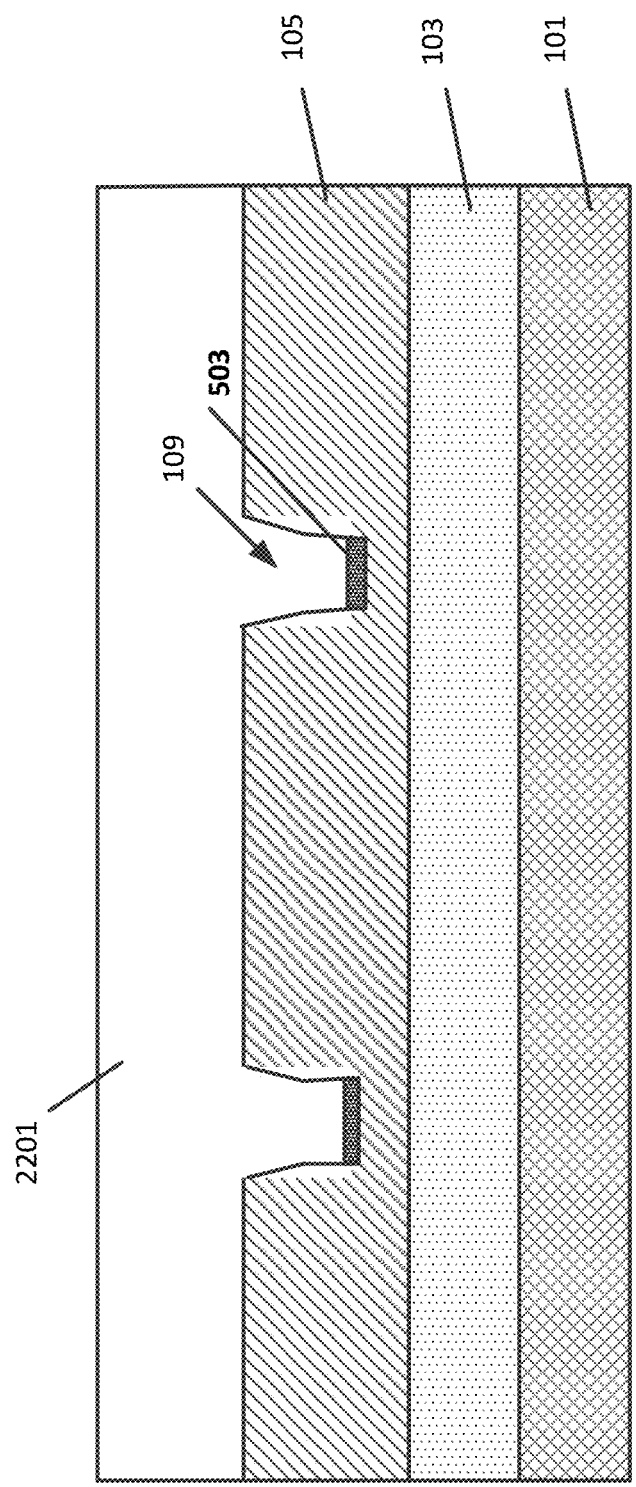
FIG. 22 illustrates depositing a second layer of polysilicon.

Next, a second layer of polysilicon 2201 is deposited (500 A to 2500 A), as illustrated in FIG. 22.

Figure 23:
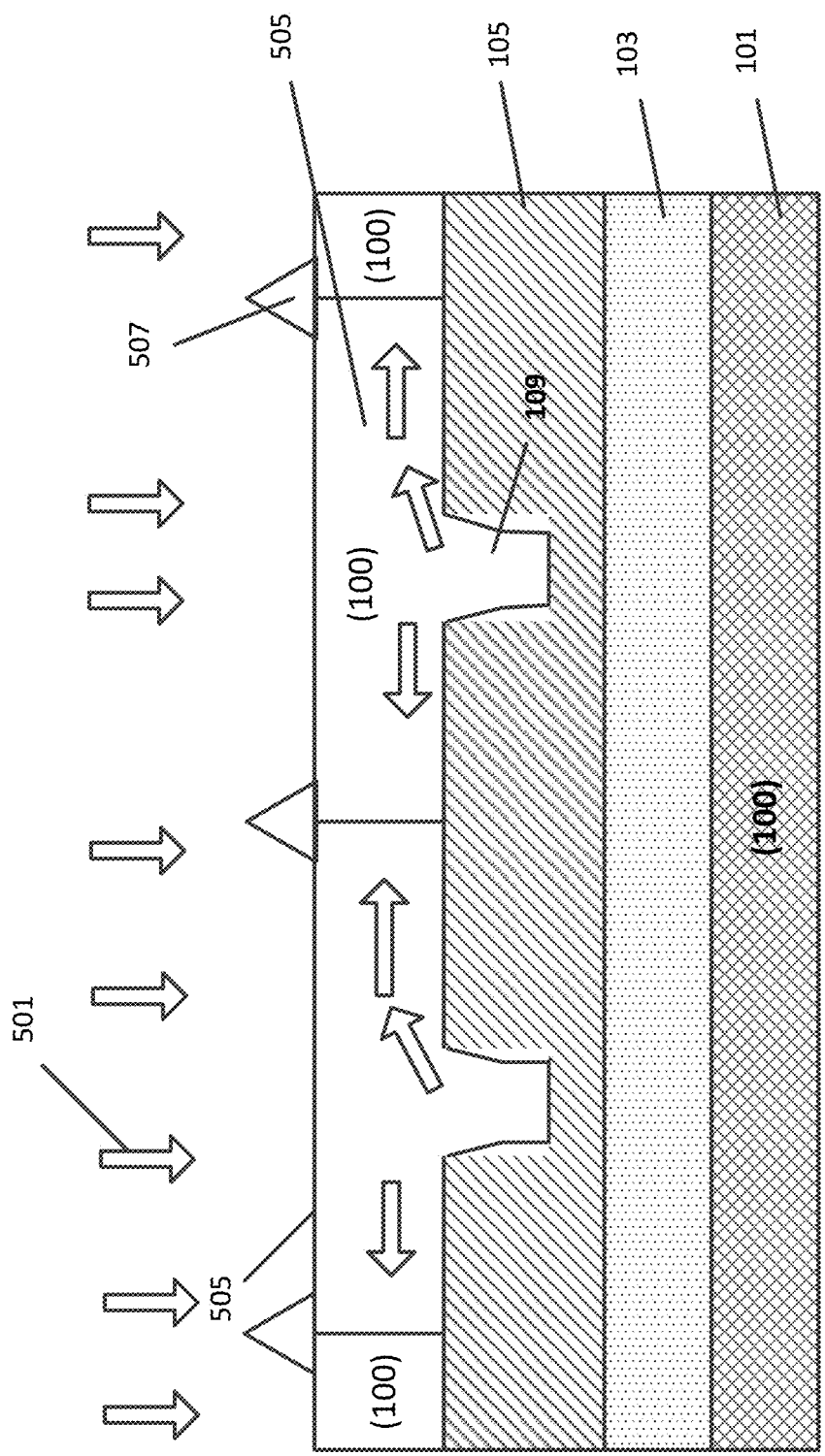
FIG. 23 illustrates annealing this second layer of polycrystalline silicon.

This second layer of polycrystalline silicon 2201 is laser annealed 501 as described above, and as shown in FIG. 23. This results in formation of single-crystal silicon having a crystal orientation corresponding to seed crystal 503 in each hole 109. In some embodiments, the crystal orientation may be (100). In other embodiments, the crystal orientation may be (110). Further, the crystal orientation may be (111). Accordingly, regions of single-crystal silicon 505 are formed above the holes.

Figure 24:
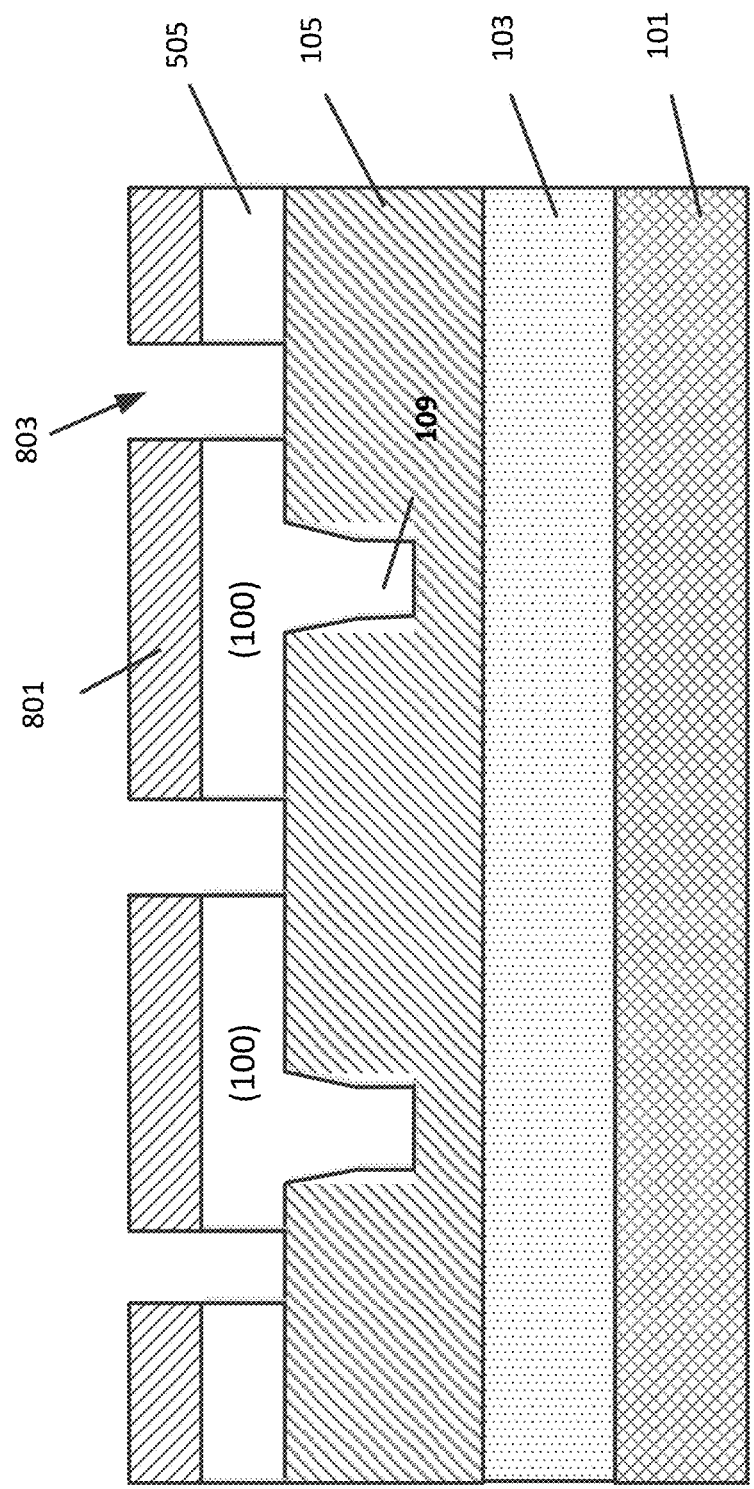
FIG. 24 illustrates removing grain boundaries between regions of single-crystal silicon using an etch mask.

As illustrated in FIG. 24, grain boundaries 601 between regions of single-crystal silicon are removed using an etch mask 801 to form trenches 803.

Figure 25:
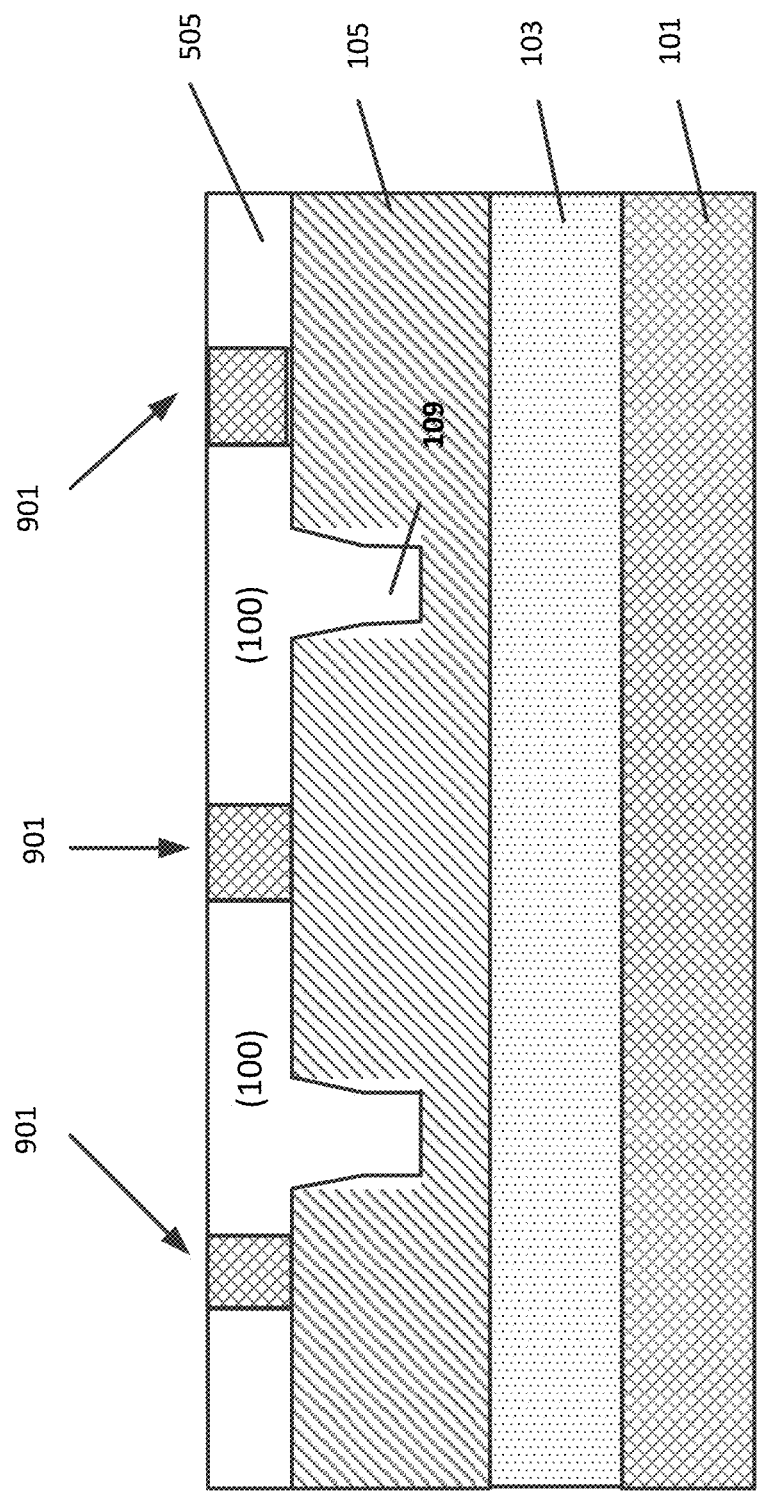
FIG. 25 illustrates replacing removed grain boundaries by a dielectric material.

As illustrated in FIG. 25, trenches 803 resulting from removed grain boundaries are then replaced by a dielectric material 901.

In another embodiment two or more metal depositions may be made to form two or more different crystal orientations without uncovering the first transistor plane.

Figure 26:
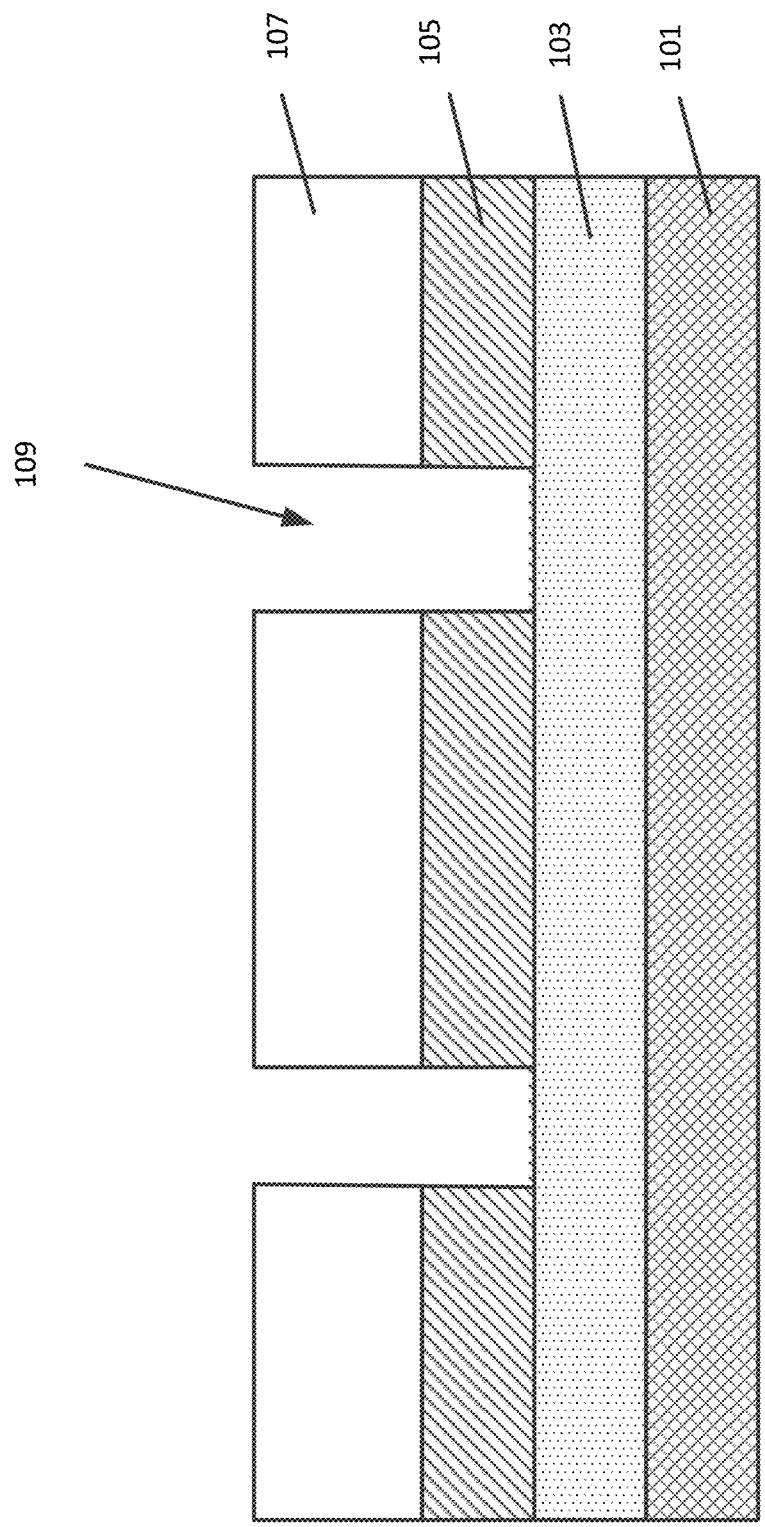
FIG. 26 illustrates depositing an oxide on the substrate and a photoresist mask to open Via holes.
Figure 27:
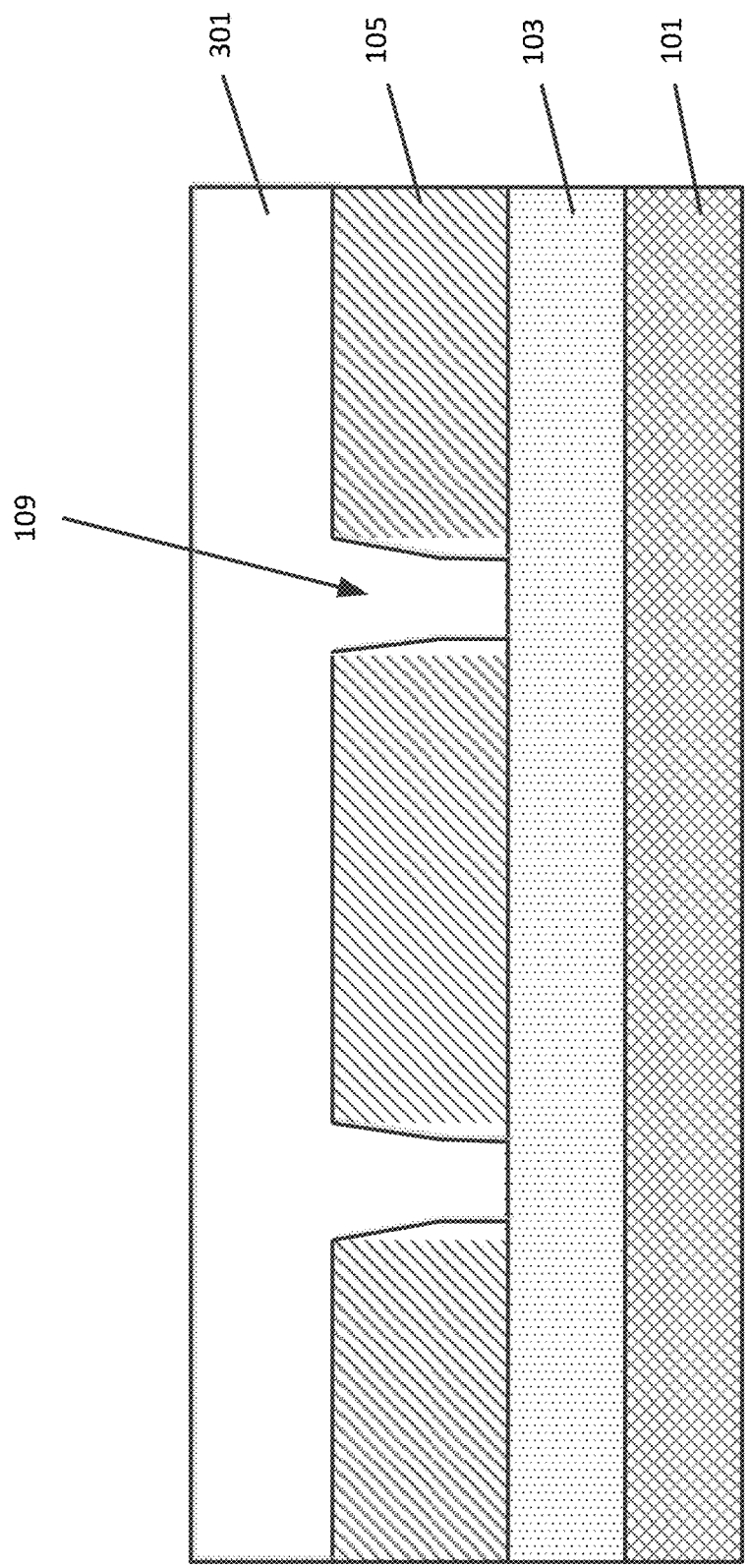
FIG. 27 illustrates removing the photoresist and depositing polycrystalline silicon.

As illustrated in FIG. 26, an oxide 105 is deposited on the substrate and a photoresist mask 107 is used to open Via holes 109, having spacing in a range of 3 to 7 microns. These open Via holes 109 are formed a predetermined depth into the oxide layer 105 without extending to the underlying transistor plane 103. For example, the etch depth can be 50% to 75% of an oxide film height. As illustrated in FIG. 27, the photoresist 107 is removed and polycrystalline silicon 301 is deposited.

Figure 28:
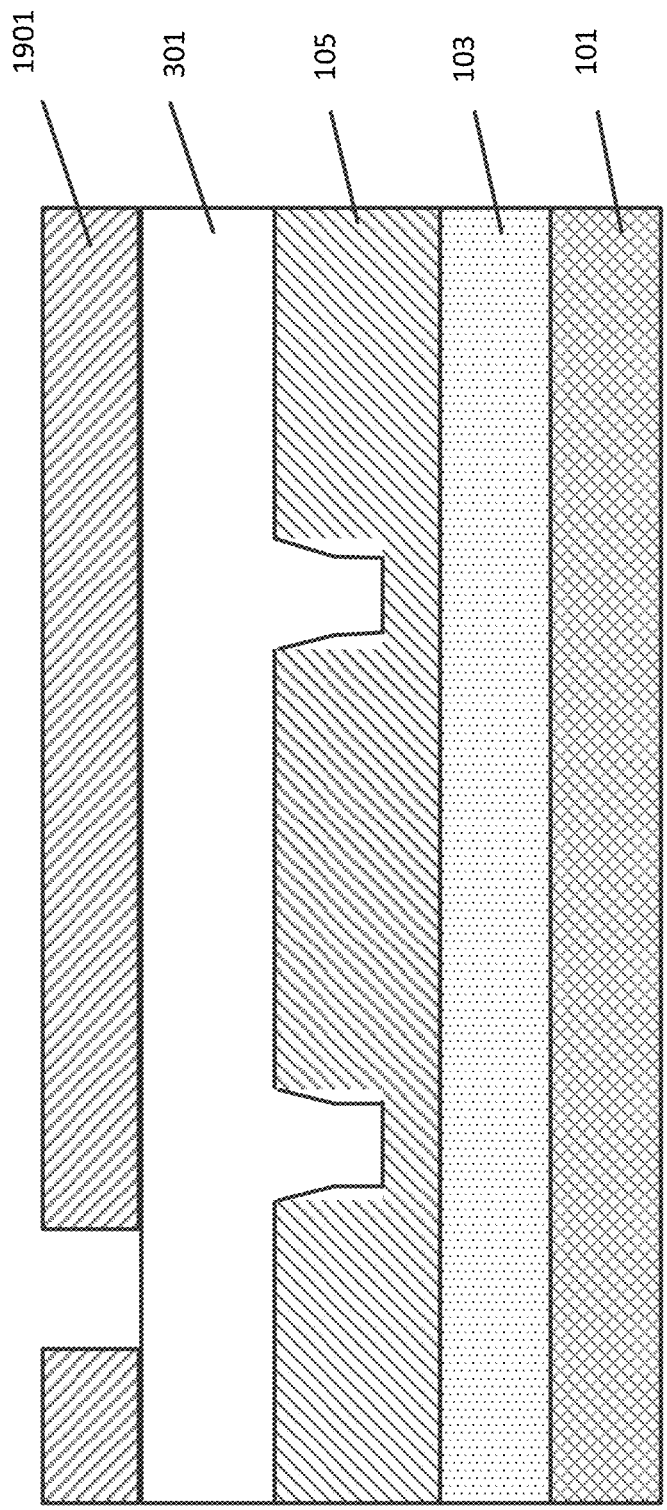
FIG. 28 illustrates forming a relief pattern on the layer of polysilicon.

As illustrated in FIG. 28, a relief pattern (dielectric material) 1901 is then formed on the layer of polysilicon 301.

Figure 29:
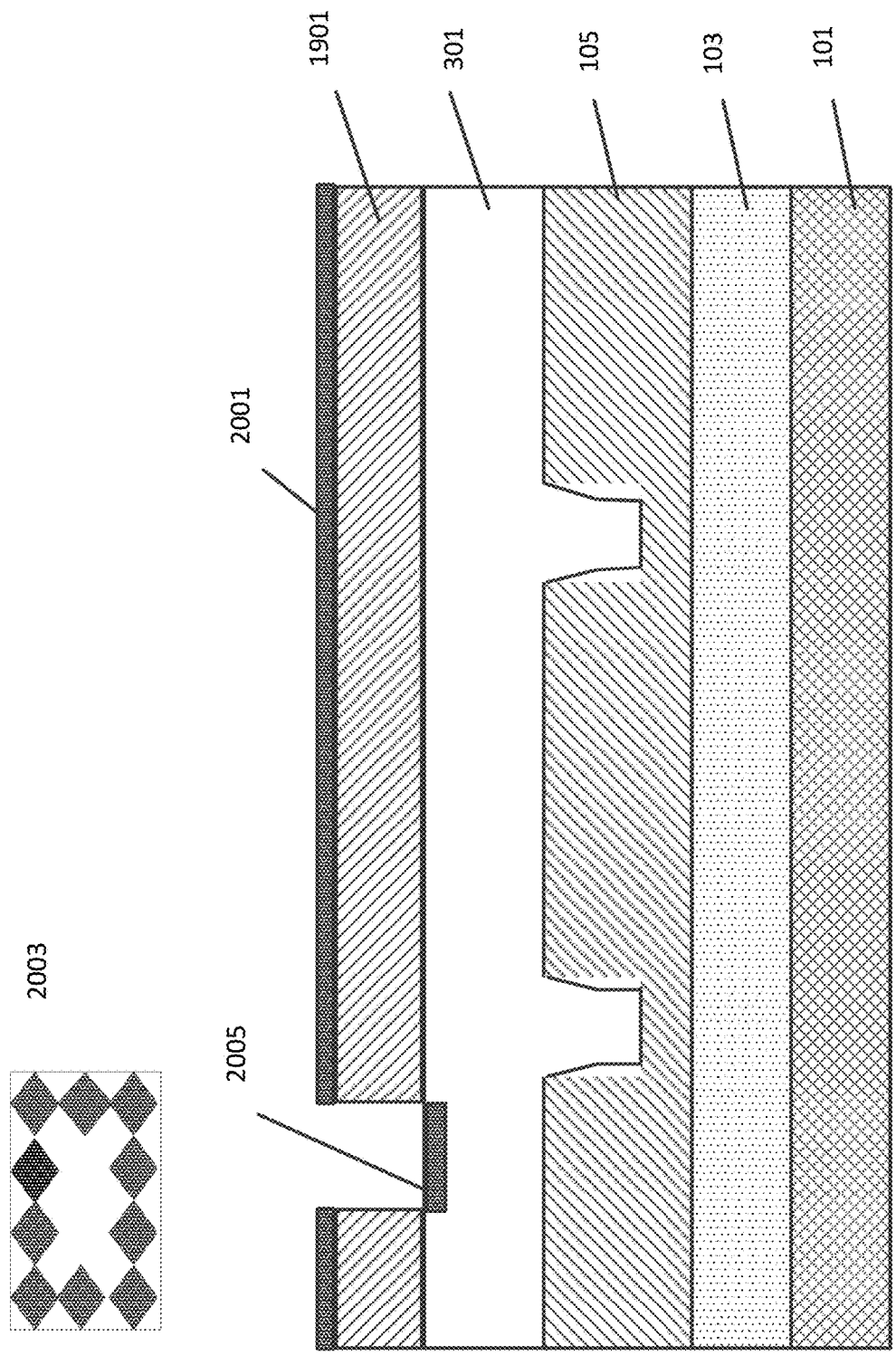
FIG. 29 illustrates depositing a first metal on the substrate.

As illustrated in FIG. 29, a first metal 2001 is deposited on the substrate. The relief pattern 1901 controls a size and shape of metal in contact with the layer of polysilicon 301. Note from a top down view of openings 2003 that openings may have a particular geometry, such as jagged lines, to help direct formation of a particular crystal orientation. In a non-limiting example, the first metal is nickel. A thickness of the first metal 2001 (such as nickel) can be deposited 50 A to 300 A (more or less). For a (100) silicon orientation a line with a jagged square opening 2003 is formed. The bottom of the opening 2003 contains a seed 2005 of silicon.

Figure 30:
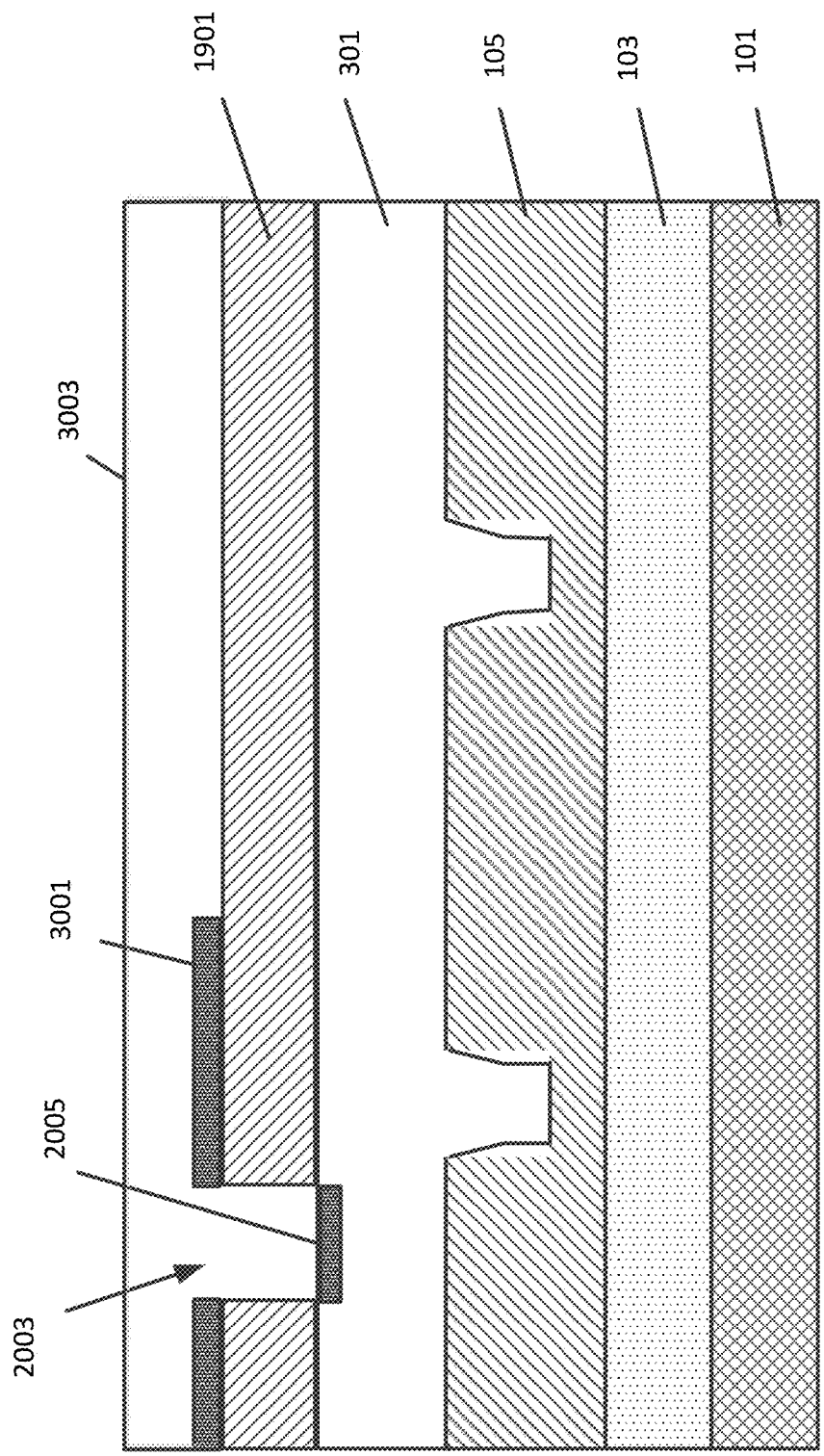
FIG. 30 illustrates flow similar to FIG. 20.

FIG. 30 includes flow similar to FIG. 20. As illustrated in FIG. 30, a photoresist mask is used to remove a region of the metal 2001 away from the opening 2003, leaving a region 3001 of metal of orientation (100). A dielectric 3003 is deposited over the remaining metal 3001.

Figure 31:
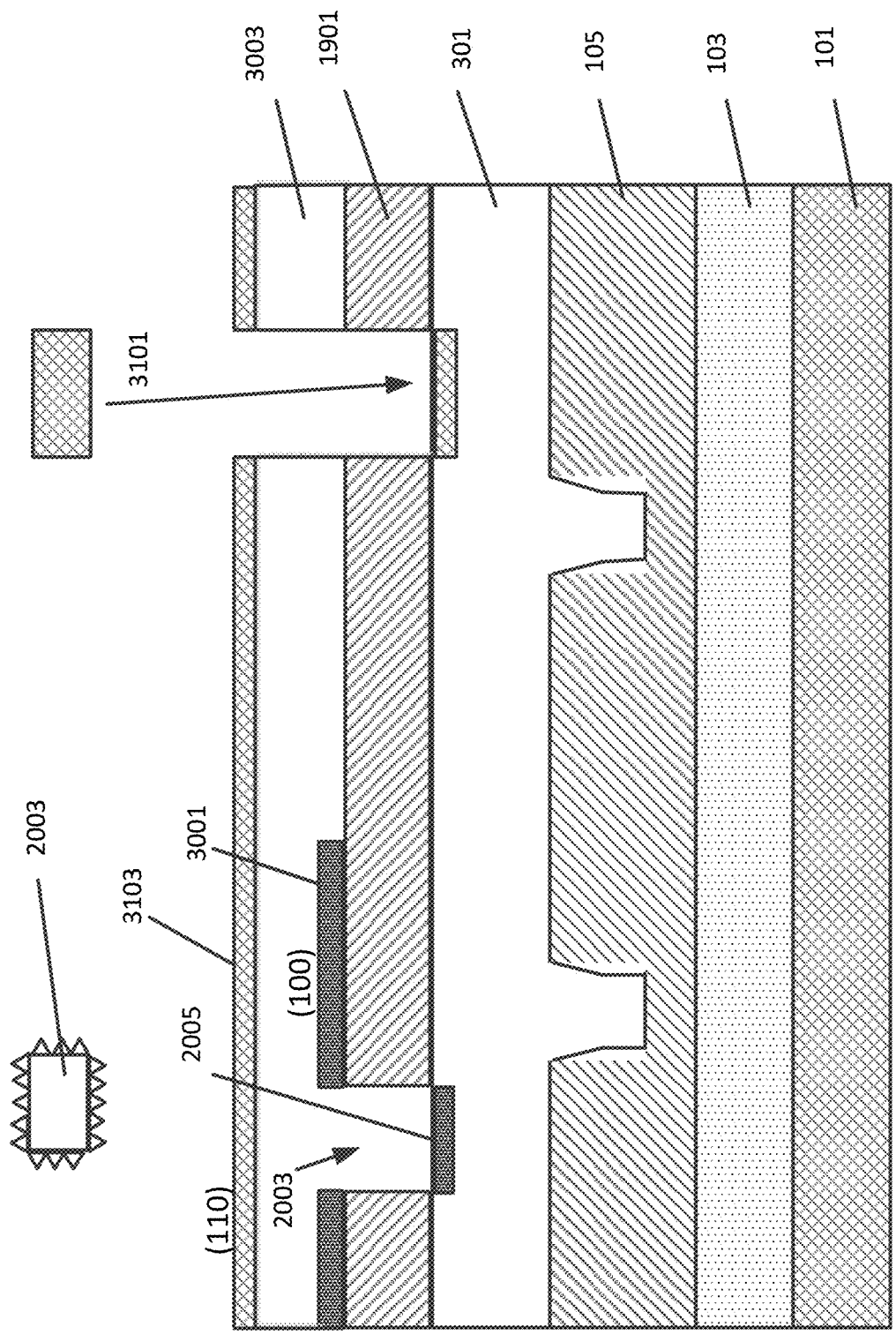
FIG. 31 illustrates a non-limiting example in which relief pattern openings are rectangular shaped, while openings of the first relief pattern for metal deposition have jagged edges.

As illustrated in FIG. 31, the dielectric is turned into a relief pattern defining openings. In particular, the photoresist mask is used to form an opening 3101 in the dielectric 3003. FIG. 31 shows a non-limiting example in which these openings 3101 are rectangular shaped, while openings 2003 of the first relief pattern for metal deposition have jagged edges. This difference in geometry, and/or type of metal deposited, can direct formation of different crystal orientations at different holes. Thus any particular hole can be used to form a single-crystal silicon region of a desired orientation. A metal 3103 having orientation (110) is deposited over the remaining dielectric 3003.

Figure 32:
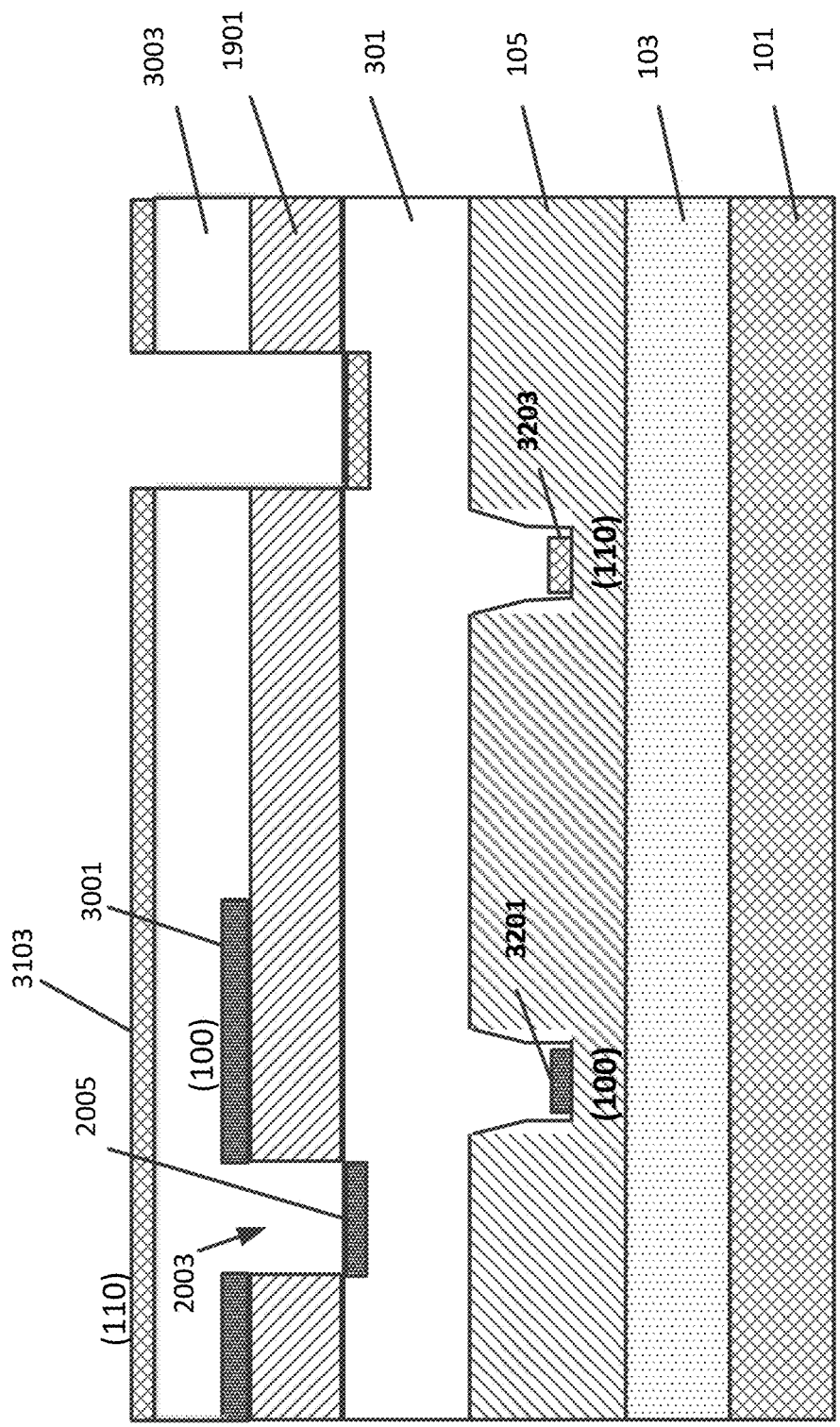
FIG. 32 illustrates directing different silicon crystal seeds into different holes corresponding to a seed above or near a given hole, where one hole has a place seed, while another hole has a plane seed.

FIG. 32 The substrate, with at least two different metal depositions on the first layer of polysilicon 301 is thermally annealed. This directs different silicon crystal seeds into different holes corresponding to a seed above or near a given hole. The laser annealing process is performed for about 2 to 4 hours at 400 to 600 C, resulting in a seed 3201 of orientation (100) being formed at the base of a Via within polycrystalline silicon 301. A second metal seed 3203 of orientation (110) is formed at a base of a Via in another region of the polycrystalline silicon 301.

Figure 33:
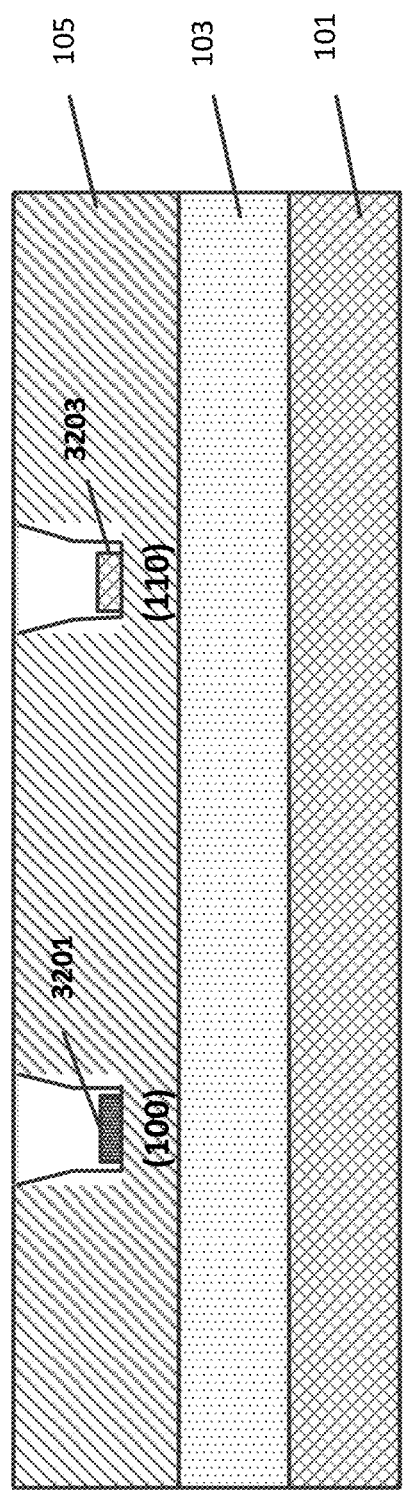
FIG. 33 illustrates removing metal and planarizing/polishing the substrate down to the first insulator layer.

Metal is removed and the substrate is planarized/polished down to the first oxide layer 105 (FIG. 33).

Figure 34:
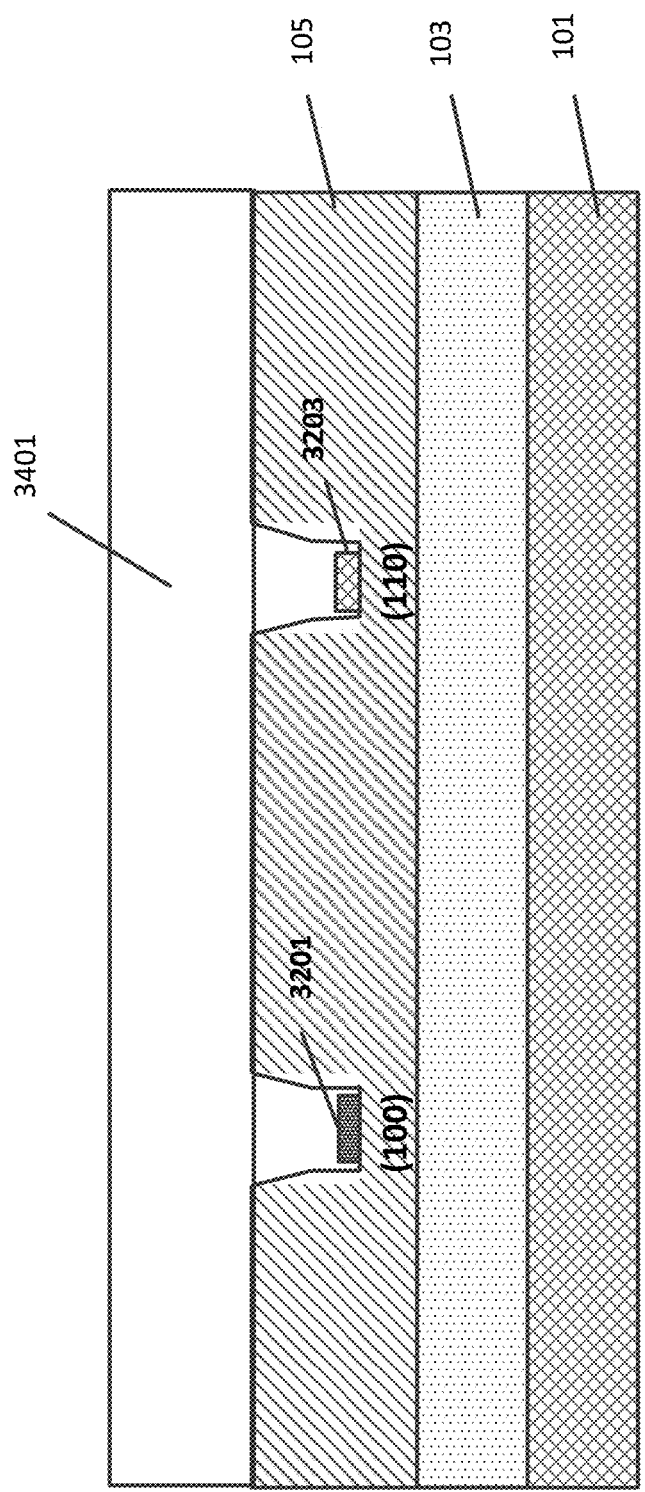
FIG. 34 illustrates the second layer of polysilicon in contact with whole materials.

A second layer of polycrystalline silicon 3401 is deposited. FIG. 34 illustrates the second layer of polysilicon 3401 in contact with hole materials.

Figure 35:
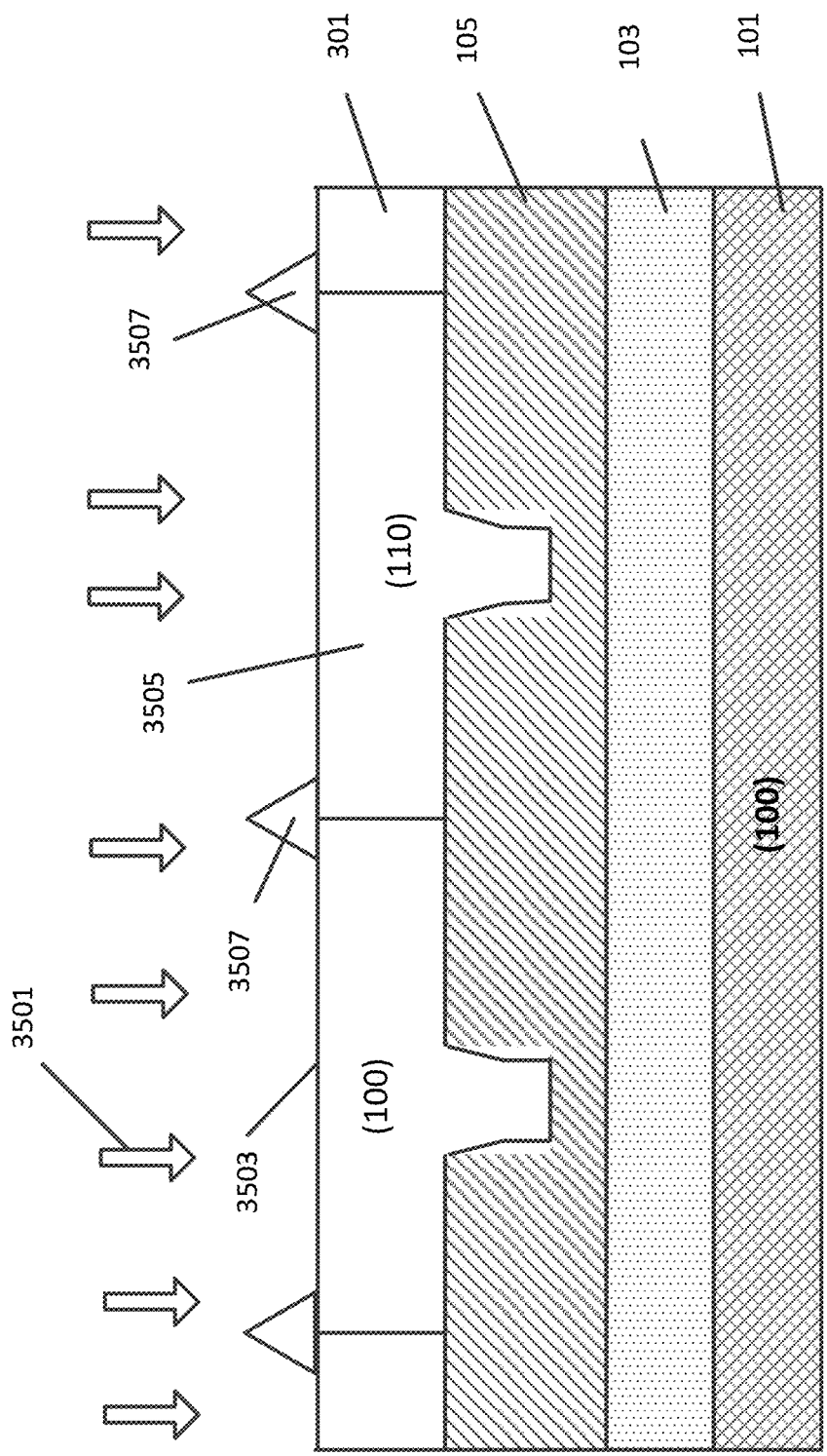
FIG. 35 illustrates laser annealing the second layer of polycrystalline silicon.

This second layer of polycrystalline silicon 3401 is laser annealed 3501 as described above, and as shown in FIG. 35. This results in formation of single-crystal silicon having a crystal orientation corresponding to seed crystal in each hole. Accordingly, regions of different crystal orientation single-crystal silicon are formed above the holes. The example of FIG. 35 shows a 100 plane region 3503, between grain boundaries 3507, adjacent to a 110 plane region 3505.

Figure 36:
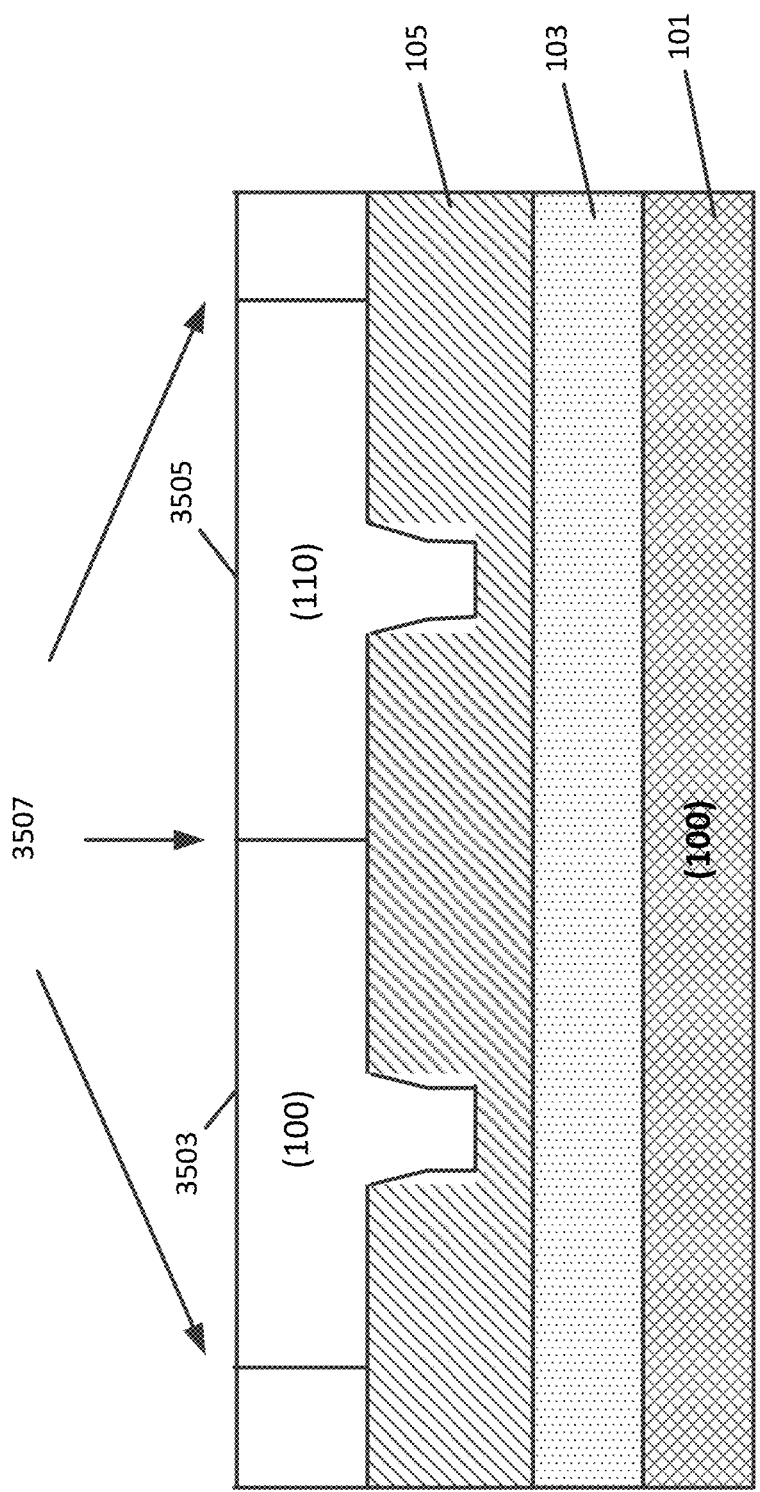
FIG. 36 illustrates polishing the substrate to reduce roughness.

As illustrated in FIG. 36, the substrate may be polished to reduce roughness. In one embodiment, single crystal silicon regions 3503 and 3505 between grain boundaries 3507 may be CMP polished and cleaned. Single crystal silicon with preferred orientations may be reduced in height to a preferred height. In some embodiments, the height of the single crystal silicon may be reduced by oxidation or silicon etching, or combinations thereof.

Figure 37:
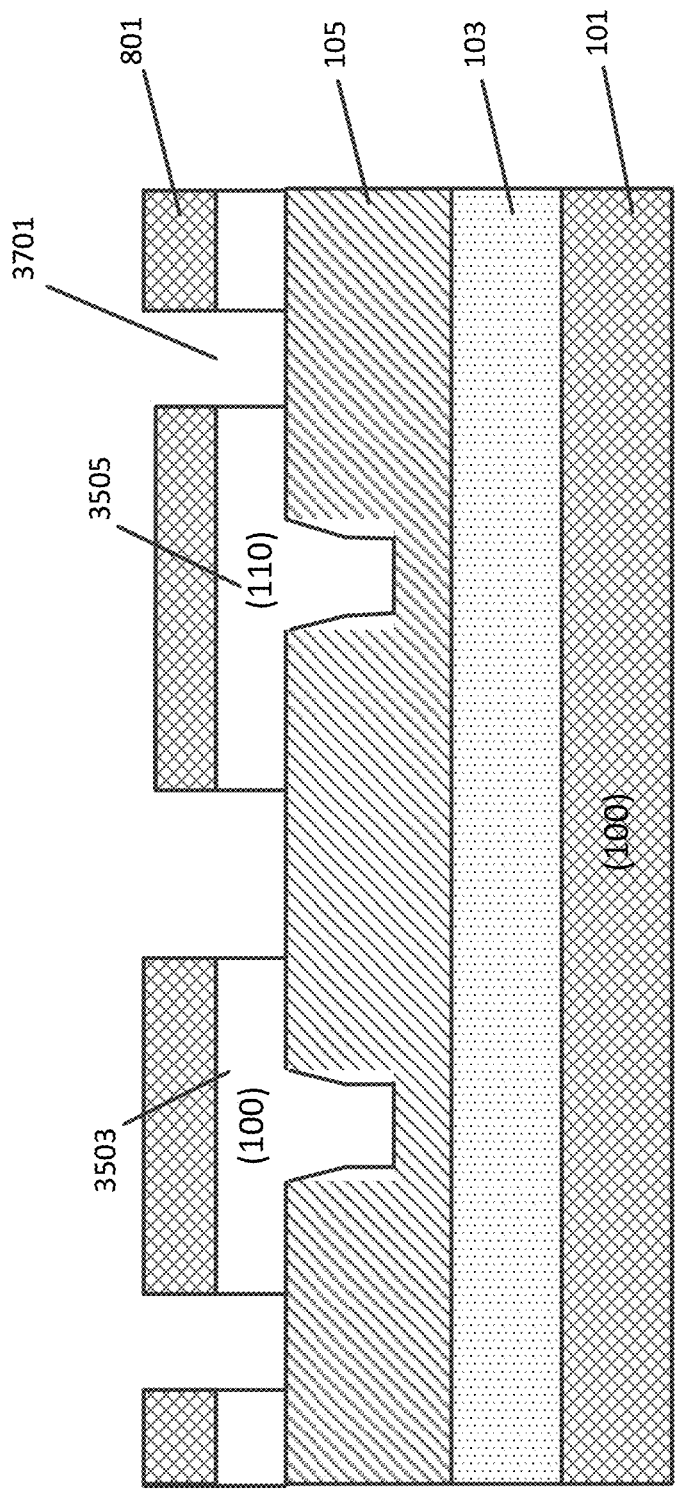
FIG. 37 illustrates removing grain boundaries between regions of single-crystal silicon using an etch mask.

As illustrated in FIG. 37, grain boundaries between regions of single-crystal silicon are removed using a photoresist etch mask 801, resulting in a single crystal epitaxial-like silicon. The etch mask 801 can define openings 3701 uncovering grain boundaries, which can then be removed using a reactive ion etch process.

Figure 38:
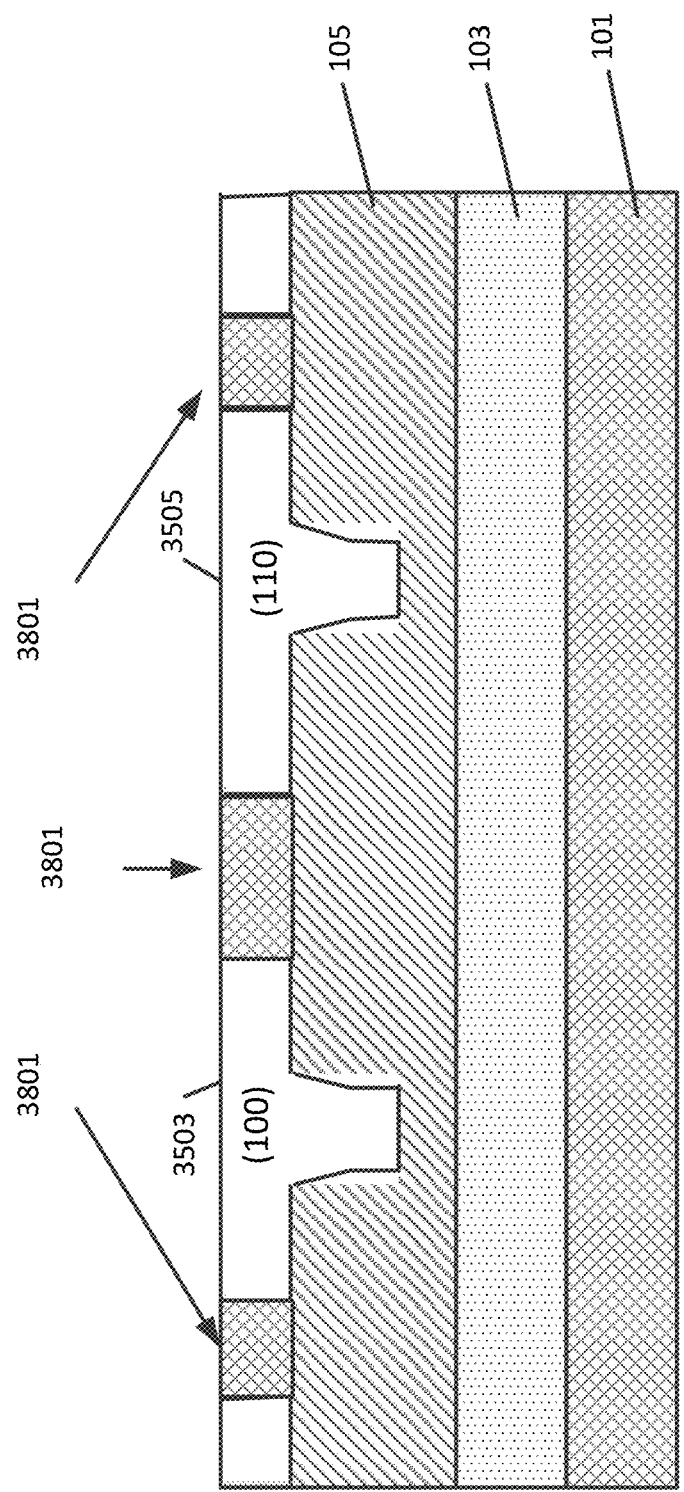
FIG. 38 illustrates replacing removed grain boundaries by a dielectric material.

As illustrated in FIG. 38, removed grain boundaries are then replaced by a dielectric material 3801.

In another embodiment, such as starting from FIG. 3 or FIG. 12, after the layer of polysilicon is deposited, this first layer of polysilicon is etched at expected grain boundaries to remove the silicon prior to laser annealing. This essentially results in pads of polycrystalline silicon over holes, with each pad separated by trenches. Such trenches can have a cross sectional width similar to that used for grain boundary removal, or can have wider trenches to accommodate reflow during laser annealing. In this embodiment, during laser annealing, the polysilicon can be converted to single-crystal silicon with minimal grain boundaries or no grain boundaries as crystal orientations merge.

Accordingly, techniques herein enable multiple levels of transistors on a substrate using true monolithic fabrication. Techniques herein form single-crystal silicon by converting polycrystalline silicon to single crystal with few process steps and without harming transistor devices on underlying planes. Specific crystal orientations are enabled on elevated planes of silicon. Moreover, multiple single-crystal orientations can be formed on a single plane of silicon. Having a mixture of planes enables a wider distribution of drive current available for an integrated circuit design. Both 3D logic and memory can be processed with single-crystal silicon on multidimensional silicon planes. Techniques are compatible with CFET flows and other 3D flows. Enhanced performance and reliability are enabled herein due to better silicon formation providing multiple silicon properties (i.e. mobility, Idsat, Idoff, Vtc control). Any type of LOGIC, transistor type (CFET, PLANER, Finfet) can be fabrication on each new plane of epitaxial-like silicon planes created by laser anneal. Processes herein enable continued vertical stacking to achieve needed 3D density for N+1 transistor/logic/memory planes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming 3D transistor devices, the method comprising:
   forming a first transistor plane on a substrate, the first transistor plane including at least one layer of field effect transistors;
   depositing a first insulator layer on the first transistor plane;
   forming holes in the first insulator layer using a first etch mask;
   depositing a first layer of polycrystalline silicon on the first insulator layer, the first layer of polycrystalline silicon filling the holes and covering the first insulator layer;
   annealing the first layer of polycrystalline silicon using laser heating, the laser heating creating regions of single-crystal silicon above the first transistor plane; and
   forming a second transistor plane in the created regions of single-crystal silicon.

2. The method of claim 1, wherein the forming the holes includes forming holes in the first insulator layer at a predetermined spacing and location.

3. The method of claim 2, wherein the predetermined spacing and location of the holes defines a location of grain boundaries.

4. The method of claim 1, wherein the forming the holes includes etching partially into the first insulator layer without uncovering the first transistor plane.

5. The method of claim 1, further comprising narrowing the holes to result in sloped sidewalls such that a hole diameter narrows from a top surface of the first insulator layer to a depth within the first insulator layer.

6. The method of claim 1, further comprising planarizing the first layer of polycrystalline silicon subsequent to annealing the first layer of polycrystalline silicon and prior to removing grain boundaries.

7. The method of claim 1, wherein the forming the holes includes etching through the first insulator layer and uncovering a top surface of the first transistor plane,
   wherein the depositing the first layer of polycrystalline silicon on the first insulator layer includes depositing the first layer of polycrystalline silicon to contact the top surface of the first transistor plane, filling the holes, and covering the first insulator layer, and
   wherein the annealing the first layer of polycrystalline silicon using laser heating creates the regions of the single-crystal silicon having a crystal orientation corresponding to the top surface of the first transistor plane that is in contact with each region of polycrystalline silicon through a corresponding hole.

8. The method of claim 1, further comprising:
   removing grain boundaries separating the regions of single-crystal silicon using a second etch mask so that the regions of single-crystal silicon are separated by trenches; and
   filling the trenches with a dielectric material.

9. The method of claim 1, wherein a top surface of the first transistor plane is a top surface of a stack of silicon formed by epitaxial growth.

10. A method of forming 3D transistor devices, the method comprising:
    forming a first transistor plane on a substrate, the first transistor plane including at least one layer of field effect transistors;
    depositing a first insulator layer on the first transistor plane;
    forming holes that extend partially into the first insulator layer using a first etch mask;
    depositing a first layer of polycrystalline silicon on the first insulator layer, the first layer of polycrystalline silicon filling the holes and covering the first insulator layer;
    forming a first relief pattern on the first layer of polycrystalline silicon, the first relief pattern defining openings of a first geometry that uncover first portions of the first layer of polycrystalline silicon;
    depositing a first metal on the substrate, the first metal being deposited within the defined openings of the first relief pattern and adopting the first geometry such that depositions of the first metal having the first geometry are in contact with the first layer of polycrystalline silicon;
    thermally annealing the first layer of polycrystalline silicon, the first metal having the first geometry inducing crystallization of silicon of a first orientation within the holes;
    planarizing the substrate down to a top surface of the first insulator layer;
    depositing a second layer of polycrystalline silicon on the first insulator layer, the second layer of polycrystalline silicon being in contact with crystallized silicon filling the holes;
    annealing the second layer of polycrystalline silicon using laser heating, the laser heating creating regions of single-crystal silicon having the first orientation above the first transistor plane; and
    forming a second transistor plane in the created regions of single-crystal silicon.

11. The method of claim 10, further comprising:
    removing grain boundaries separating the regions of single-crystal silicon using a second etch mask so that the regions of single-crystal silicon are separated by trenches; and
    filling the trenches with a dielectric material.

12. The method of claim 10, wherein forming the holes includes forming holes in the first insulator layer at a predetermined spacing and location.

13. The method of claim 12, wherein the predetermined spacing and location of the holes defines a location of grain boundaries.

14. The method of claim 10, wherein forming the holes includes the etching partially into the first insulator layer without uncovering the first transistor plane.

15. The method of claim 10, further comprising planarizing the first layer of polycrystalline silicon subsequent to annealing the first layer of polycrystalline silicon and prior to removing grain boundaries.

16. The method of claim 10, wherein the first orientation is a 100 plane orientation crystal structure.

17. The method of claim 10, wherein the first orientation is a 110 plane orientation crystal structure.

18. The method of claim 10, wherein the first orientation is a 111 plane orientation crystal structure.

19. The method of claim 10, wherein after the depositing the first metal and before the thermally annealing,
  forming a second relief pattern on the first layer of polycrystalline silicon, the second relief pattern defining second openings of a second geometry that uncover second portions of the first layer of polycrystalline silicon; and
  depositing a second metal on the substrate, the second metal being deposited within the defined second openings of the second relief pattern and adopting the second geometry such that depositions of the second metal having the second geometry are in contact with the first layer of polycrystalline silicon,
  wherein the thermally annealing the first layer of polycrystalline silicon, the second metal having the second geometry inducing crystallization of silicon of a second orientation within second holes, and
  wherein the annealing the second layer of polycrystalline silicon using laser heating, the laser heating creating regions of single-crystal silicon having a given orientation from corresponding holes.

20. The method of claim 19, wherein the first geometry induces a 100 plane orientation, and wherein the second geometry induces a 110 plane orientation.

* * * * *